United States Patent [19]

Honma et al.

[11] Patent Number: 4,956,688
[45] Date of Patent: Sep. 11, 1990

[54] RADIATION RESISTANT BIPOLAR MEMORY

[75] Inventors: Noriyuki Honma, Kokubunji; Tohru Nakamura, Tanashi; Kazuo Nakazato; Motoaki Matsumoto, both of Kokubunji; Tetsuya Hayashida, Nishitama; Masaharu Kubo, Hachioji; Kazuhiko Sagara, Suginami, all of Japan

[73] Assignee: Hitachi, Ltd., Tokyo, Japan

[21] Appl. No.: 374,570

[22] Filed: Jun. 27, 1989

Related U.S. Application Data

[63] Continuation of Ser. No. 792,286, Oct. 28, 1985, abandoned.

[30] Foreign Application Priority Data

Oct. 29, 1984 [JP] Japan .................................. 59-225738
Oct. 29, 1984 [JP] Japan .................................. 59-225736
Oct. 29, 1984 [JP] Japan .................................. 59-225737
Oct. 31, 1984 [JP] Japan .................................. 59-227730
Mar. 20, 1985 [JP] Japan .................................... 60-54404

[51] Int. Cl.$^5$ ..................... H01L 29/72; H01L 27/12; H01L 29/04; H01L 23/48
[52] U.S. Cl. ........................................ 357/34; 357/36; 357/49; 357/59; 357/67; 357/72; 357/88; 357/92
[58] Field of Search ....................... 357/20, 34, 36, 45, 357/46, 49, 59, 67, 72, 88, 92; 365/155, 156, 179, 181

[56] References Cited

U.S. PATENT DOCUMENTS

| | | |
|---|---|---|
| 4,076,556 | 2/1978 | Agraz-Guerena et al. ......... 357/192 |
| 4,130,826 | 12/1978 | Bachle et al. .......................... 357/46 |
| 4,388,636 | 6/1983 | Lohstroh ............................... 357/34 |
| 4,400,712 | 8/1983 | O'Connor .............................. 357/46 |
| 4,425,574 | 1/1984 | Silvestri et al. .................. 357/59 H |
| 4,433,470 | 2/1984 | Kameyama et al. ............. 357/59 H |
| 4,480,319 | 10/1984 | Hotta et al. .......................... 357/36 |
| 4,488,350 | 12/1984 | Vora et al. ........................... 357/34 |
| 4,543,595 | 9/1985 | Vora .................................. 357/59 A |

OTHER PUBLICATIONS

T. Nakamura et al., "Self-Aligned Transistor with Sidewall Base Electrode", *IEEE Transactions on Electron Devices*, Vol. ED-29, (Apr. 1982), pp. 596-600.
H. Sakurai et al., "A New Transistor Structure for High Speed Bipolar LSI", *Japanese Journal of Applied Physics*, vol. 19 (1980), Supplement 19-1, pp. 181-185.
D. D. Tang et al., "Asymmetrical Bipolar Structure", *IEEE Electron Devices Meeting*; (Dec. 1980), pp. 58-60.

*Primary Examiner*—J. Carroll
*Attorney, Agent, or Firm*—Antonelli, Terry, Stout & Kraus

[57] ABSTRACT

A bipolar memory of a construction having high immunity from soft error attributable to alpha rays is provided. The transistors of a flip flop, i.e., the essential circuit of the memory cell, are inverted, and the load device thereof has a shielding arrangement for shielding the flip flop from the noise produced within the substrate. Either pnp type transistors or Schottky barrier diodes are employed as the load devices. A buried layer (ordinarily, an n type layer) and a doped layer of the reverse conductivity type (ordinarily the p type) are formed in the region where the device is provided. A reverse bias is applied across the buried layer and the doped layer to shut off the noise produced within the substrate.

37 Claims, 36 Drawing Sheets

☐ n+BL  ▦ p POLY Si
☐ METAL  ☐ n POLY Si

RADIATION RESISTANT BIPOLAR MEMORY

This application is a continuation of application Ser. No. 792,286, filed on Oct. 28, 1985 abandoned.

BACKGROUND OF THE INVENTION

1. Field of the Invention:

The present invention relates to a semiconductor memory and, more particularly, to a bipolar memory having improved immunity from soft error attributable to the noise created by radiation such as alpha rays.

Further, the present invention relates to a high-speed diode construction resistant to noise from the substrate, employed as a load for the above-mentioned bipolar memory.

Still further, the present invention relates to a high-performance vertical transistor construction resistant to noise from the substrate, employed as a load for the above-mentioned bipolar memory

2. Description of the Prior Art:

It is a well-known fact that the incidence of alpha particles, although very small, radiated from the material forming the package (a container accommodating a semiconductor chip) into a semiconductor substrate produces electron-hole pairs, which destroys the information stored in the semiconductor memory. Such destruction of information was foudd first in MOS memories. Thereafter, soft error has been found also in bipolar memories; and contriving measures to obviate soft error has been a significant problem in designing semiconductor memories.

Prior to the description of the present invention, the process of the occurrence of soft error in the bipolar memory attributable to alpha rays will be described.

FIGS. 1A to 1I are circuit diagrams of widespread conventional typical bipolar memory cells. The cells of FIGS. 1A to 1E have constructions securing high-speed operation at a low power consumption rate. In the nonselected state, a stand-by current is supplied to a load resistor having a high resistance to obtain a desired voltage swing, while in the selected state, the load is changed to a load having a low impedance in order to supply a large read (or write) current. FIGS. 1F to 1I show cross-coupled pnpn cells particularly suitable for constructing a compact device. These cells are compact and suitable for constructing a large-capacity device, however, when an additional capacitance is given thereto to reinforce the alpha ray resistance, the memory cell area is increased to disadvantage.

FIG. 2 is a typical plan view of the memory cell of FIG. 1A. In FIG. 2, there are shown the terminals 3C, 3B and 3E for the collector, the base and the emitter, respectively. FIG. 3 is a sectional view taken along line aa' of FIG. 2. In FIG. 3, $n^-$ layer (epitaxial layer) 36 and $n^+$ buried layer ($n^+$ BL) 30 are a collector region. The diode of FIG. 1A is formed between a $p^+$ layer 31 and the $n^+$ BL 30. The resistance 12 (FIG. 1A) is formed by a p layer 32 and the transistors (FIG. 1A) are formed by emitter $n^+$ layers 33 and 34 and by a base $p^+$ layer 35 and the $n^-$ layer 36. Indicated at 301 is a thick insulating film for separating the devices.

When radiation, such as alpha rays, including the radiation radiated from the components of the IC, such as the package, and cosmic rays falls on the memory cell having such a sectional construction, a large amount of electron-hole pairs are produced within the semiconductor as illustrated in FIG. 3. As illustrated in FIG. 3, more electron-hole pairs are produced within a silicon substrate 37 supporting the component devices (transistors, resistors, diodes and the like) of the memory cell than within those component devices. (Typically, the thicknesses of the $n^-$ Ep layer 36 and the $n^+$ BL layer 30 are 1 to 2 $\mu$m, whereas the range of alpha particles is as large as 50 to 70 um.) The electrons of the electron-hole pairs produced within the silicon substrate diffuse and approach the $n^+$ BL 30. Upon the arrival at the depletion layer between the $n^+$ BL 30 and the silicon substrate 37 (p-substrate), the electrons are accelerated by the electric field of the depletion layer and reach the $n^+$ BL layer 30 (the collector of the transistors). These electrons are the principal cause of soft error in the memory LSI by alpha rays. That is, these electrons produce a noise current and, when a large noise current is produced, the stored information is destroyed. Suppose that the $n^+$ BL 30 in which the electrons collect is the collector of the off-side transistor of FIG. 1A, the electrons enter the collector of the off-side transistor, namely, the base of the on-side transistor 18, as illustrated in FIG. 1A. Thereby, the base voltage of the transistor 18 drops and the on-side transistor tends to become an off-state. When the charge of the electrons is large, the base voltage of the transistor 18 drops below the base voltage of the transistor 19, and thereby the stored information is inverted. Means taken to prevent such soft error is: (1) preventing the incidence of alpha rays, (2) suppressing the accumulation of charge when the incidence of alpha rays occurs, or (3) providing the memory cell with noise current resistant characteristics. The first means is a well-known means in which the surface of the chip is coated with a film of a substance not containing any source of alpha rays having a thickness not less than several tens of microns. According to this means, the film having a thickness greater than the range of alpha rays, namely, the possible distance of intrusion of alpha rays into a substance, prevents alpha rays from reaching the silicon substrate. As the second means, appropriately controlling the distribution of the impurity concentration in the silicon substrate has been proposed. As the third means, inserting a capacitor between the collector node and the ground or a node equivalent to the ground from the viewpoint of AC has been proposed.

FIGS. 4A to 4C show examples of such means to prevent alpha rays. In the example shown in FIG. 4A capacitors are inserted between the collectors and the grounds, respectively, of the memory cell. The insertion of the capacitors suppresses the variation of the potential of the collectors even if a noise current is produced, and hence the possibility of soft error is reduced. The insertion of the capacitors as illustrated in FIG. 4A enhances the immunity from soft error attributable to alpha rays, however, the time constant of the collector becomes large, which affects adversely to the high-speed performance of the bipolar memory. When capacitors are inserted as illustrated in FIG. 4B, the capacitors function as a speed-up capacitor when the memory cell is driven, and hence this insertion of the capacitors improves both the operating speed and the immunity from alpha rays. However, those capacitors need to be those having a considerably large capacitance (not less than several fractions of a picofarad), and hence it is difficult to apply the configuration of FIG. 4A to a practical memory cell. The example shown in FIG. 4B is disclosed in Japanese Unexamined Patent Publication No. 54-29935. A memory cell illustrated in FIG. 4C is an example of a memory cell developed by solving the abovementioned problem. This memory cell employs the depletion capacitance of a Schottky barrier diode (abbreviated to "SBD" hereinafter) as a capacitor. This SBD is more capable of providing a large capacitance comparatively easily than an ordinary pn junction by increasing the impurity concentration o the silicon substrate. Although three means of improving the immunity of the memory cell from alpha rays has been described hereinbefore, none of then is sufficiently effective when applied individually. Practically, the combination of the first and third means is employed. The example shown in FIG. 4C is disclosed in Japanese Unexamined Patent Publication Nos. 53-79331 and 53-97343.

In the initial stage of microminiaturization, the ratio of an SBD to the memory cell in area was 10% or less, and hence the employment of an SBD or the like as an additional capacitance was satisfactory. However, since a certain satisfactory degree of the immunity from alpha rays requires a capacitance of a fixed value, the ratio of the SBD to the memory cell in area has increased with the advancement of microminiaturization and the area of the memory cell has not been decreased according to the miniaturization. When microminiaturized, the parasitic capacitance of the memory cell is reduced, whereas the capacitance of the SBD remains unchanged. Consequently, the capacitance of the SBD becomes greater than ten times the other capacitance, which deteriorates the stability of the memory cell. (Concretely, when the memory cell is changed over between the selected state and the non-selected state, the signal swing is reduced to an extremely small extent.)

SUMMARY OF THE INVENTION

It is an object of the present invention to provide a compact memory cell having improved immunity from soft error attributable to radiation which does not need any additional capacitor.

It is another object of the present invention to provide a stable memory cell having improved immunity from soft error attributable to radiation which does not need any large capacitor.

It is a further object of the present invention to provide a construction ensuring the stable operation of an SBD, which is an important element as the load of a very large scale integrated circuit, particularly, as the load of a bipolar memory, regardless of noise signals produced in the substrate, in order to realize a minute device.

It is a still further object of the present invention to provide a novel construction of a vertical transistor without the disadvantages of a lateral transistor, which is an important element as a load of a very large scale integrated circuit, particularly, that of a bipolar memory.

According to the present invention, the influence of radiation on the memory is reduced to the least extent through the inverse operation of a transistor. That is, the electrons produced by the stimulation of radiation, such as alpha rays, are collected to affect the emitter side through the inverse operation of an ordinary bipolar transistor.

Furthermore, according to the present invention, a load device and a transistor are formed individually in separate isolation areas to enhance the operating speed.

Still further, according to the present invention, a pnp transistor employed as a load device is operate inversely.

Furthermore, according to the present invention, a shield layer is formed under a pnp transistor or an SBD employed as a load device, as a barrier against electrons produced by the stimulation of radiation such as alpha rays.

Thus, according to the present invention, a thin p-type layer is formed over an n-type buried layer to isolate the substrate electrically from a pnp transistor or an SBD in order to enable the pnp transistor or the SBD to operate stably regardless of the local potential of the substrate.

The above and other objects, features and advantages of the present invention will become more apparent from the following description of the preferred embodiments thereof taken in conjunction with the accompanying drawings.

DETAILED DESCRIPTION OF THE INVENTION

The present invention will be described in detail hereinafter with reference to the preferred embodiments thereof. The following description consists generally of three sections.

In the first section, the memory cell of an inverse operating bipolar transistor is described in detail.

In the second section, improvements in an SBD for the load of a bipolar memory are described in detail.

In the third section improvements in a pnp transistor for the load of a bipolar memory are described in detail.

Figure 3:
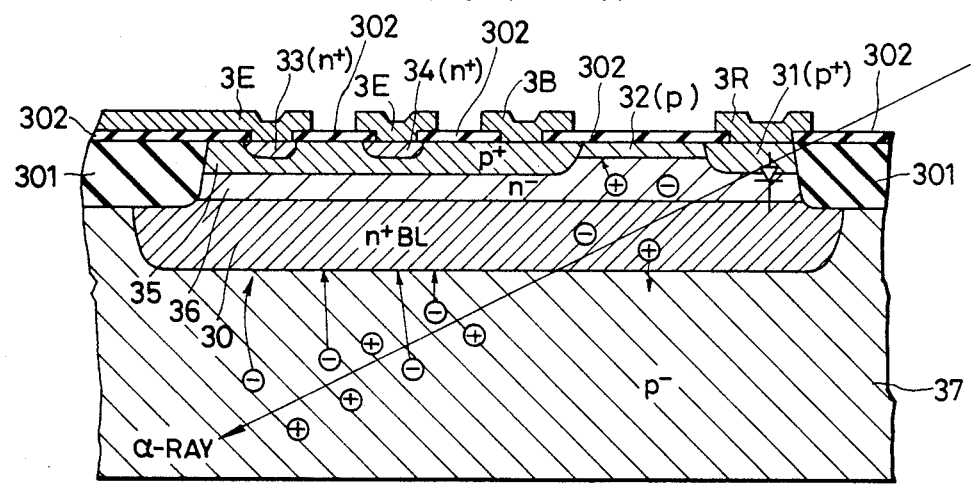
Figure 5A:
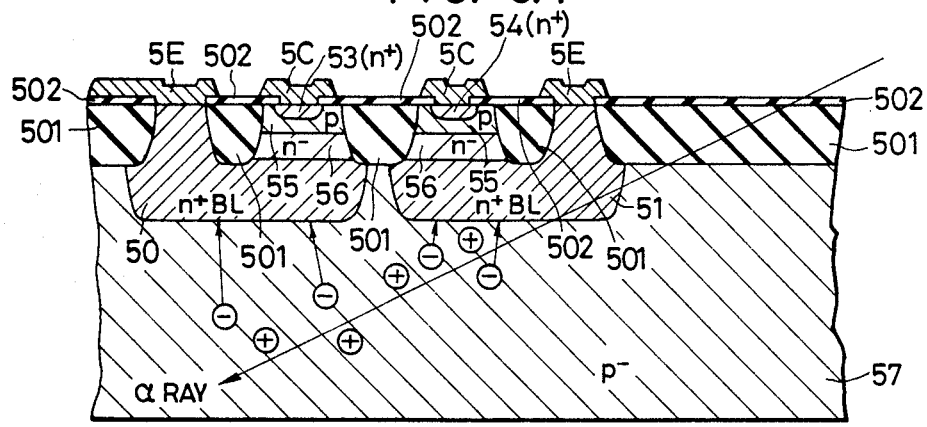
FIGS. 5A to 5C, 6, 7A and 7B are illustrations of assistance in explaining the basic constructions of memory cells according to the present invention.
Figure 6:
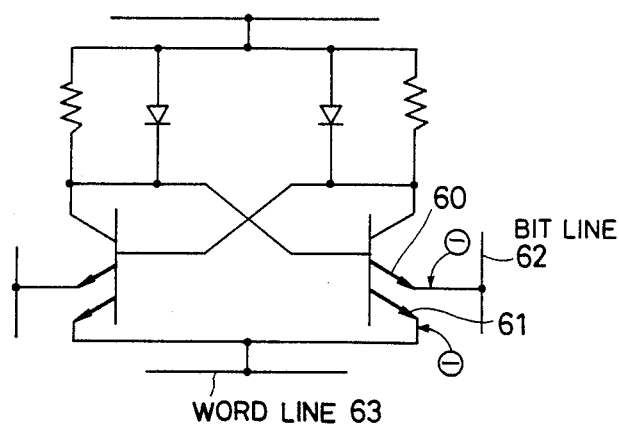

Embodiment 1:

FIG. 5A is a sectional view of a double-emitter transistor of a memory cell, in a first embodiment, according to the present invention, and FIG. 6 is a circuit diagram of an equivalent circuit of the double-emitter transistor of FIG. 5A. In this embodiment, the conventional collector and emitter are used as the emitter and collector, respectively, of a transistor. Accordingly, an n+ BL 50 and an n+ BL 51 of FIG. 5A correspond to an emitter 60 and an emitter 61 of FIG. 6, respectively. In FIG. 6, the emitters 60 and 61, namely, n+ BLs, are indicated by bold lines. Thus, the electrons gathered in the n+ BLs 50 and 51 are collected by a bit line 62 and a word line 63, respectively, and hence the charge of these electrons does not cause soft error. Accordingly, only the charge produced in the transistor portion formed above the n+ BLs, namely, n+, p and n− layers in FIG. 5A, involves the soft error attributable to alpha rays. As apparent from the drawings, only a small amount of charge, as compared with that produced in the p-type silicon substrate, is produced in the transistor portion (actually, even in the worst case, the amount of charge produced in the transistor portion is approximately one-tenth of that produced in the p-type silicon substrate). Thus, the memory cell of the present invention is inherently immune from soft error attributable to alpha rays. FIGS. 3 and 5A illustrates examples of memory cells formed by oxide isolation technology, however, naturally, the memory cells may be formed by any suitable isolation technology.

Figure 7A:
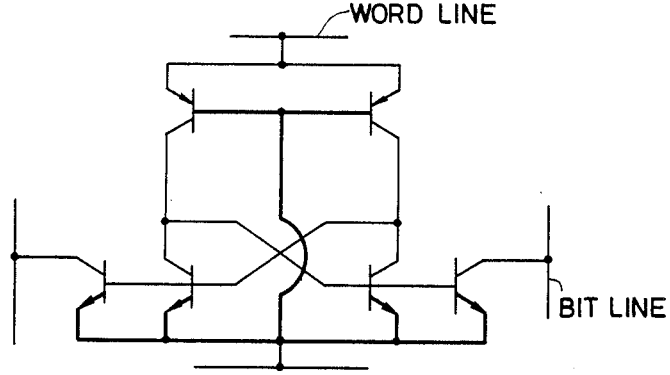
Figure 7B:
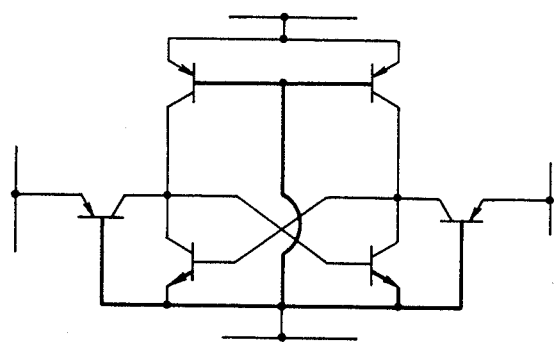

Incidentally, the use of an n+ BL and a conventional emitter as an emitter and a collector of a transistor, respectively, is well known as so-called $I^2L$. Two representative $I^2L$ memory cells (Wiedmann, S. K. "Injection-coupled Memory: A High-density Static Bipolar Memory", $IE^3$ J. of Solid State Circuits, SC, pp. 332, October, 1973; and Kawarada, K. et al., "A 4K-bit Static $I^2$ L Memory", $IE^3$ Trans. on Electron Devices, vol. ED-26, No. 4, pp. 886, June, 1979) are shown in FIGS. 7A and 7B, in which bold lines indicate n+ BLs. As apparent from FIGS. 7A and 7B, in the $I^2L$ memory cell, both the load transistor, namely, a pnp transistor, and the coupling transistor, namely, an npn or a pnp transistor, and npn transistors constituting a flip flop commonly have one and the same n+ BL. That is, the load transistor and the coupling transistor are formed on one and the same n+ BL and employ the n+ BL as part of the device (transistor). Accordingly, the level of immunity from alpha rays of the $I^2$ L memory cell will be substantially the same as that of the memory cell of the present invention. However, due to all the transistors being extremely deeply saturated and the inherent operation mechanism, the $I^2$ L memory cell is capable of high-speed read and write.

According to the present invention, n+ BLs 50 and 51 for the transistors of a flip flop and n+ layers for a load device and/or a bit coupling device are formed separately on different silicon islands, respectively. Therefore, the memory cell of the present invention is somewhat greater than the $I^2$ L memory cell in cell area, however, the memory cell of the present invention is capable of operating at a high speed, which is incomparably higher than that of the $I^2$ L memory cell.

Figure 5B:
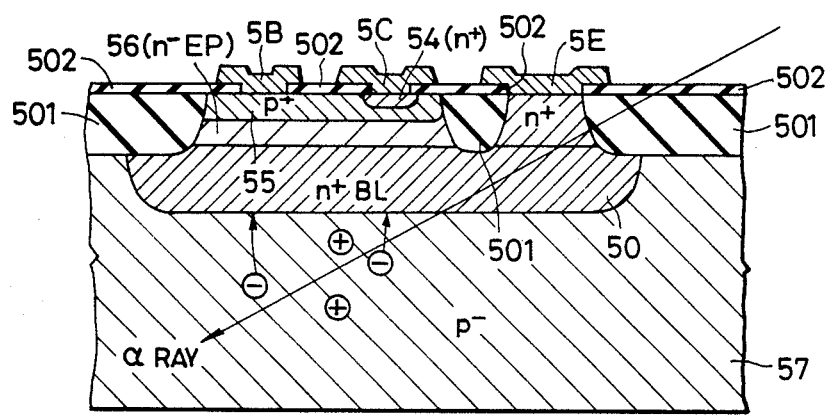

An example of a transistor employed in the present invention is shown in FIG. 5B. According to the present invention, all the transistors are inversely connected, that is, the emitter and the collector are interchanged. As illustrated in FIG. 5B, an n+ BL is used as an emitter. Therefore, electrons produced by alpha rays gather in the collector in a conventional memory cell, whereas the same electrons gather in the emitter in the memory cell of the present invention. As apparent from the circuit diagrams of FIGS. 1A to 1I, since the emitter of the memory cell transistor is connected to a word line (lower word line) or a bit line, the electrons gathered in the emitter are collected in the word line or the bit line. Since the word line and the bit line are provided with large capacitors (about 10 pF), the potential variation is, at the maximum, about 50 mV even if all the electrons produced by alpha rays (about $5 \times 10^{-13}$ C. at the maximum) gather in one n+ BL. Besides, the word line or the bit line is charged or discharged by the memory cell or the transistors of the peripheral circuit when potential variation occurs in the word line or bit line (low impedance also in DC operation), and hence, practically, the potential variation is suppressed still further, so that soft error in the memory cell or the malfunction of the same does not occur. In FIG. 5B, a transistor manufactured through the oxide isolation process is shown by way of example, however, the transistor may be manufactured through any suitable process.

Figure 5C:
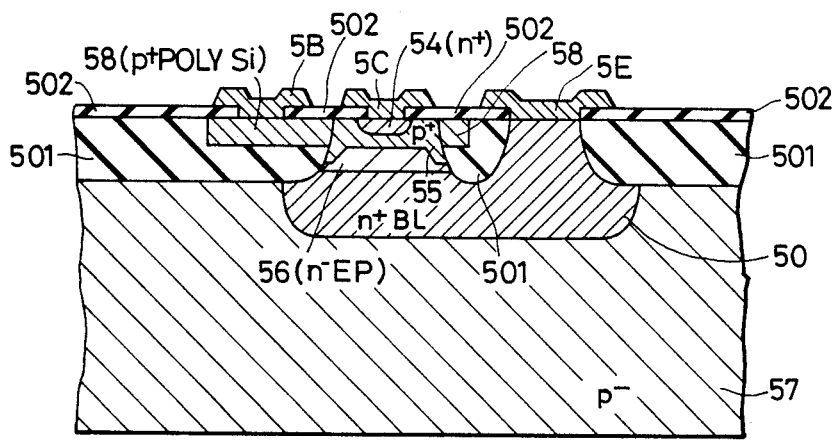

Incidentally, in the transistor having a construction as shown in FIG. 5, the collector region 54 is considerably smaller than the emitter region 56 (n− EP). Accordingly, only a small portion of the charge supplied from the emitter to the base reaches the collector, and thereby $h_{FE}$ is reduced. FIG. 5C illustrates a transistor having an improved construction eliminated of such a drawback, in which a p+ type polycrystalline silicon layer 58 for base contact is formed on the side wall of the transistor (Japanese Unexamined Patent Publication No. 56-1556). The emitter region 56 and the collector region 54 of this transistor have the substantially same area, therefore, the characteristics, such as $h_{FE}$ and $f_T$, of this transistor are substantially the same in the inverse operation and normal operation. Thus the following embodiments of the present invention will be described as employing transistors having a construction as illustrated in FIG. 5C. Naturally, transistors of any construction are applicable to the present invention, provided that they are inverted.

Embodiment 2:

A second embodiment of the present invention will be described hereinafter. The second embodiment is a bipolar memory cell employing an SBD as a load device. The SBD employed in the embodiment as the load device is provided with a shield layer for inhibiting the intrusion of electrons produced in the substrate into the bipolar memory cell. The second embodiment is capable of high operating speed (high read and write speed) which is higher than that of a third embodiment of the present invention which will be described afterward.

Figure 8A:
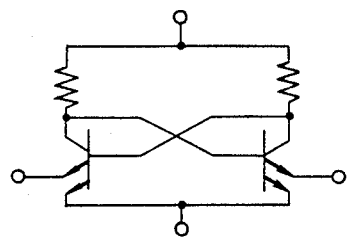
FIGS. 8A through 31 are illustrations of assistance in explaining constructions of memory cells employing shield SBDs as loads, respectively.
Figure 8D:
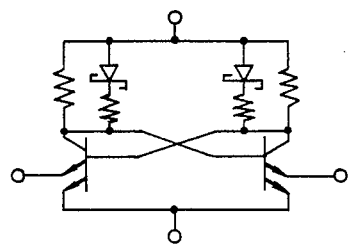
Figure 8B:
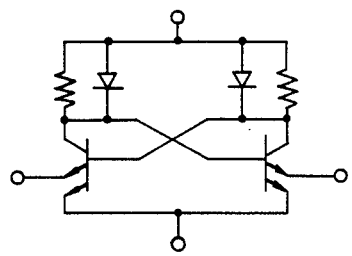
Figure 8E:
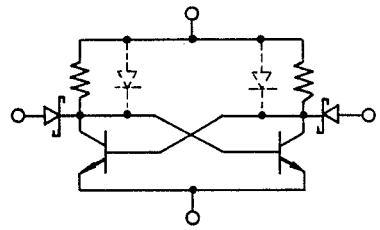
Figure 8C:
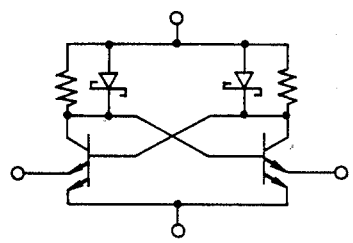
Figure 8F:
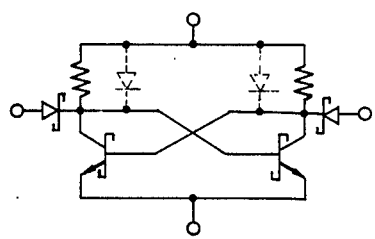
Figure 9A:
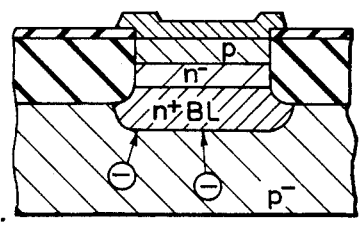
Figure 9B:
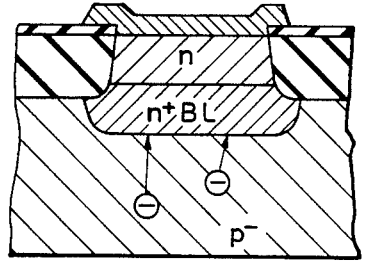

FIGS. 8A to 8F and 9A to 9D illustrate examples of representative memory cells according to the present invention. FIG. 8A illustrates a flip flop having resistors as loads, employing an npn transistor as a bit line coupling device. According to the present invention, the flip flop transistor and the bit line coupling transistor are inverted (the n+ BL is used as an emitter). The emitters are indicated by bold lines. In the drawings illustrating other memory cells, bold lines indicate n+ BLs used as emitters in the inverted connection. Any resistor may be employed as the load resistor of the collector, however, preferably, a resistor which is immune to a noise current produced by alpha rays, for example, a polycrystalline silicon layer formed over an insulating layer is employed, which will be described afterward. A memory cell shown in FIG. 8B is the same as that shown in FIG. 6. When this memory cell is provided with an ordinary junction diode such as shown in FIG. 9A, electrons produced by alpha rays gather in an n+ BL serving as a cathode. Naturally, since the transistor itself produces noise current scarcely, this memory cell is sufficiently immune from alpha rays as compared with the conventional memory cell. However, it is desirable that the load resistor and the diode each have a construction which is not subject to the influence of noise current produced by alpha rays, in order to further enhance the immunity of the memory cell from alpha rays. Such a purpose can be achieved by a polycrystalline silicon diode formed over an insulating film. FIG. 8C illustrates a memory cell in which the collector of a memory cell transistor is clamped with an SBD. When the SBD is such a conventional SBD as illustrated in FIG. 9B, electrons gather at the cathode. Therefore, it is desirable that this SBD also is immune from noise current produced by alpha rays. FIG. 8D illustrates a memory cell also employing an SBD, which, desirably, has the same construction as that of an SBD which will be described with reference to FIG. 8E. FIGS. 8E and 8D illustrate memory cells each employing an SBD as a bit line coupling device, in which the diodes indicated by broken lines may be omitted. Desirably, these memory cells also are provided with load devices which are immune from noise current produced by alpha rays. Prior to the description of the rest of the embodiments, such load device will be described in connection with memory cells of the present invention corresponding to the circuit shown in FIG. 1B or 1C.

Figure 1A:
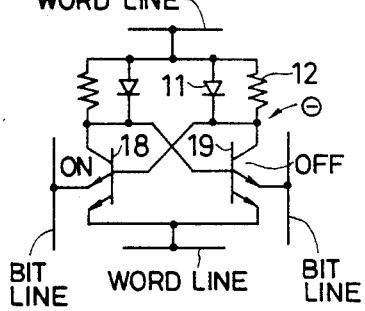
FIGS. 1A to 1I, 2, 3 and 4A to 4C are illustrations showing the examples of conventional memory cells.
Figure 10:
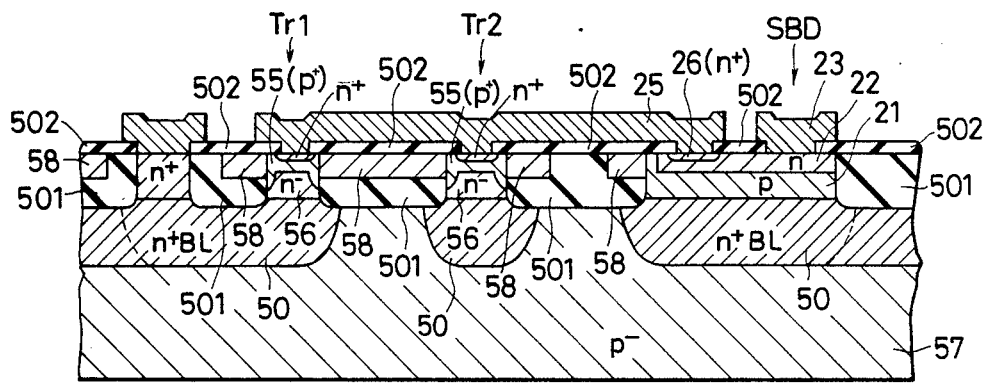

FIG. 10 illustrates, in a sectional view, a portion of a memory cell according to the present invention, including transistors Tr1 and Tr2 and an SBD. As mentioned above, the transistors Tr1 and Tr2 are inverted. One of the transistors Tr1 and Tr2 is a transistor for read current and the other is a transistor for stand-by current; and either the former or the latter may be used for either purpose. However, in view of the convenience of layout, it is general to use the transistor Tr1 for read current and the transistor Tr2 for stand-by current. It is convenient from the viewpoint of layout, regardless of the purposes of the transistors Tr1 and Tr2, to use an n+ BL 50 commonly both for the transistor Tr1 and a adjacent transistor (a transistor equivalent to the transistor Tr1) on the left-hand side of the transistor Tr1. It is also convenient to use the n+ BL of the transistor Tr2 commonly both for the transistor Tr2 and an adjacent transistor (a transistor equivalent to the transistor Tr2) formed above or below, as viewed in the drawing, the transistor Tr2 in the same memory cell. It is also possible to use the n+ BL of the transistor Tr2 of an adjacent cell disposed above or below the present memory cell, as viewed in the drawing, commonly both for the transistors Tr2 of the adjacent memory cells. Naturally, the N+ BLs of the transistors Tr1 and the transistor equivalent to the transistor Tr1 may be formed separately as indicated by broken lines in FIG. 10. The memory cell of the present invention employs a shield SBD so that the charge produced in the p− substrate will not gather at the cathode. That is, the SBD is formed between an electrode 23 and an n type semiconductor 22. A p type layer 21 and an N+ BL 50 are formed between the n type layer 22, i.e., the cathode of the SBD, and a p− type substrate 57. The N+ BL 50 and a p type layer 21 are only to be connected, similarly to the N+ BLs (emitters) of the transistors Tr1 and Tr2, to a node which is unaffected by noise current, such as a bit line, a signal line similar to a bit line, simply, to a power source of a suitable potential or, most preferably, a word line. When the n+ BL and the P type layer 21 are connected to the word line, the n+ BL and the P type layer 21 are supplied with the same voltage. Thus, the n+ BL and the Pt type layer 21 are not reversely biased relative to each ohter, but there is a built-in potential so that the P type layer 21 still has a shield effect. Therefore, it is important that the n+ BL and the P type layer 21 are not forwardly biased to each other. The p type layer 21 is connected to such a node through a p type polycrystalline silicon layer 58 having the same construction as or similar to that of the polycrystalline silicon layer for base contact of the transistor. The potentials of the p type layer 21 and the N+ BL 50 need to meet a condition that the junctions between the substrate 57 and the N+ BL 50, between the N+ BL 50 and the p type layer 21, and between the p type layer 21 and the n type layer 22 are in reverse bias. In the construction shown in FIG. 10, when potentials meeting such a condition are applied to the regions, respectively, the noise current flows toward the N+ BL 50, hence toward the node or the power source connected to the N+ BL 50 and does not reach the n type layer 22. Since the n type layer 22 is connected through an electrode 25 to the collectors of the transistors Tr1 and Tr2, the noise current produced by alpha rays does not flow into the collector node of the memory cell (except only a very little noise current produced in the n type layer 22 and the p type layer 21), and hence soft error is prevented. As illustrated in FIG. 10, it is possible to form a common N+ BL instead of separately forming the N+ BL 50 of the SBD and the N+ BL of the adjacent SBD. However, the N+ BLs may be formed separately as indicated by broken lines in FIG. 10 when preferred from the viewpoint of layout. The electrode 25 is connected through an N+ BL 26 to the n type layer 22. When a resistor is connected in series to the SBD in the memory cell of FIG. 10 as illustrated in FIG. 1C, it is possible to form a resistor between the n type layer formed directly below the SBD and the N+ BL 26 by appropriately designing the impurity concentration of the n type layer 22 and the distance between the electrode 23 and the N+ BL 26. The resistor connected in parallel to the SBD (or a series circuit consisting of the SBD and the resistor) may be a conventional resistor of any type.

Figure 11:
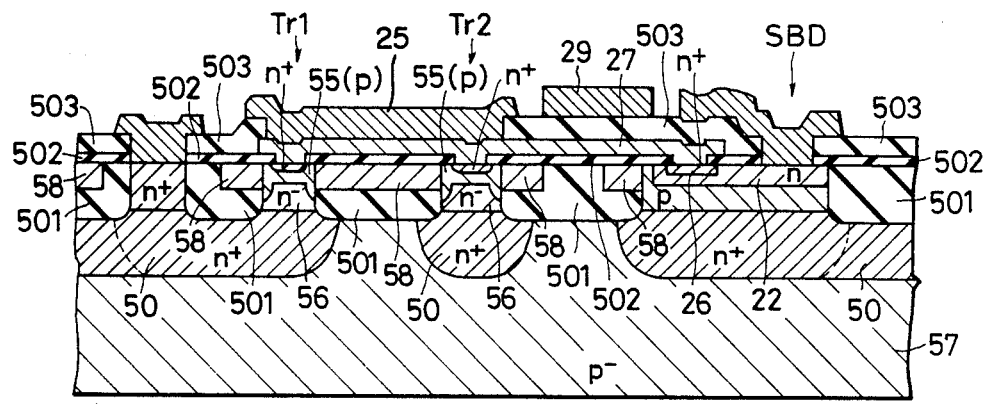

FIG. 11 illustrates a memory cell in which the N+ BL 26 of an SBD and the collectors of transistors Tr1 and Tr2 are interconnected by an N+ polycrystalline silicon layer 27. In implanting emitter impurity through a polycrystalline silicon layer by the ion implantation process or in forming an emitter through diffusion from an N+ polycrystalline silicon layer, such a construction permit the use of the polycrystalline silicon layer as the N+ polycrystalline silicon layer 27, which is convenient. In a memory cell of such a construction, an insulating layer 503 formed over the polycrystalline silicon layer 27 reduces the irregularity of the surface of the IC and reduces the area of the memory cell since an electrode 29 can be formed over the insulating layer 503. A series circuit of the SBD of the memory cell of FIG. 11 and a resistor can be formed by using the resistor of the n type layer 22 similarly to the series circuit of the memory cell of FIG. 10, however, it is also possible to form such a series circuit by appropriately designing the shape and specific resistance of the N+ polycrystalline silicon layer 27.

Figure 1B:
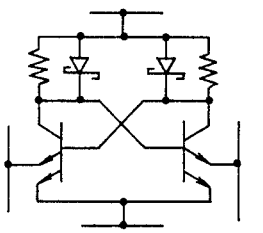
Figure 1C:
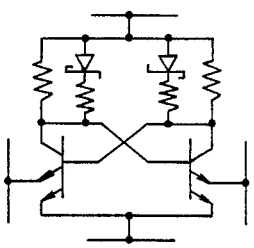
Figure 1D:
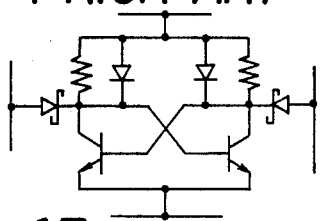
Figure 12:
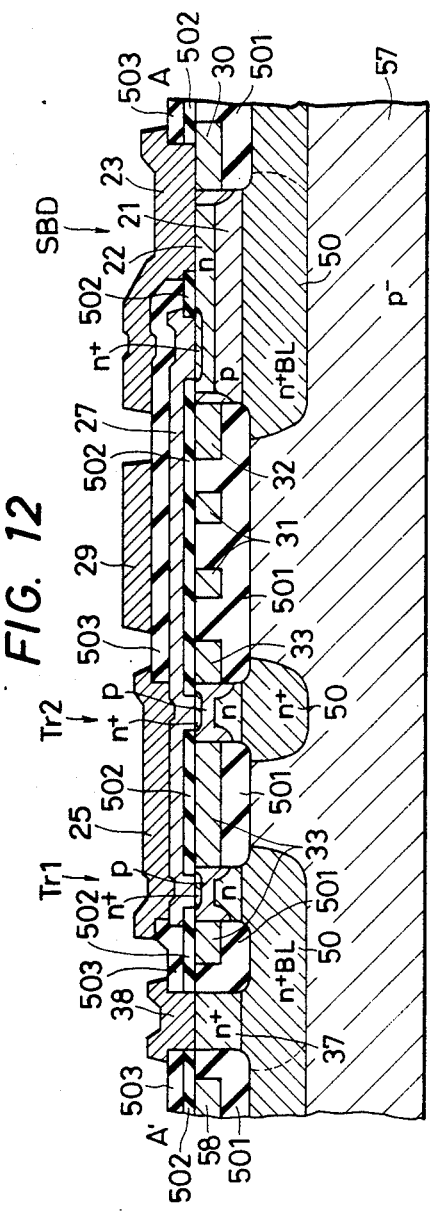
Figure 13:
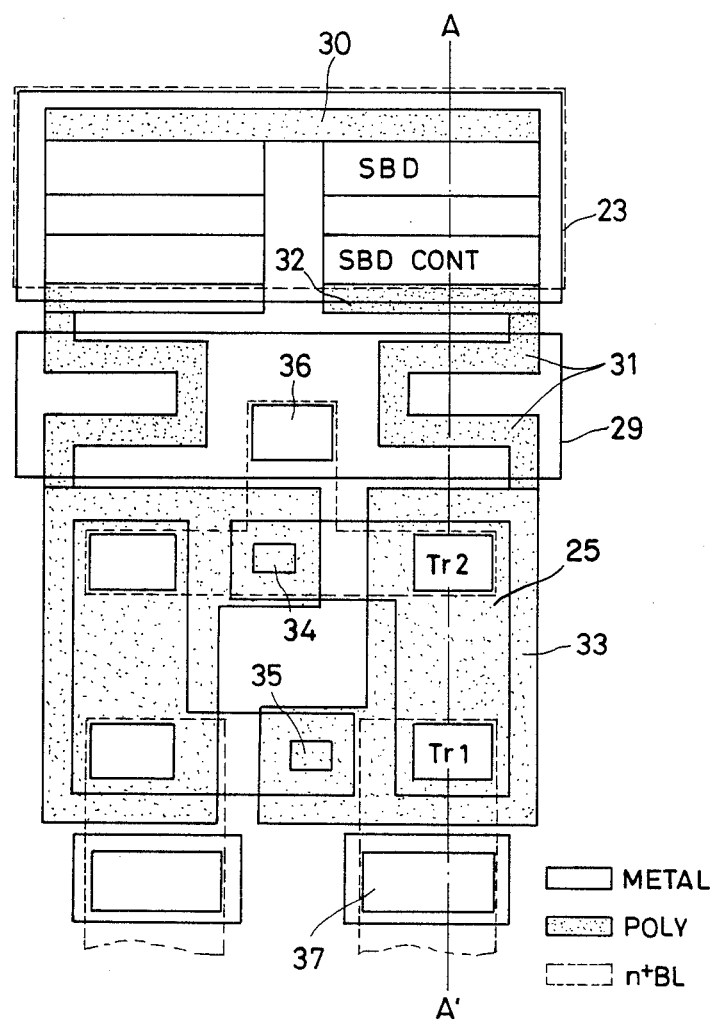

FIGS. 12 and 13 are a sectional view and a plan view, respectively, of a complete memory cell corresponding to that of FIG. 1B. FIG. 12 shows a section taken along line A—A' of FIG. 13. Electrodes 23 and 29 correspond to the upper word line and the lower word line of FIG. 1B, respectively. A p− type polycrystalline silicon layer 31 forms a resistance. One end of the resistance is connected to the electrode 23 through a p+ polycrystalline silicon layer 32, the p type region 21 of an SBD and a polycrystalline silicon layer 30. The other end of the resistance is connected through a polycrystalline silicon layer 33 to the bases of transistors Tr1 and Tr2. The emitter (N+ BL) of the transistor Tr2 is connected to another transistor Tr2 of the memory cell and to the electrode 29 (lower word line) through a contact hole 36 (c.f. FIG. 13). On the other hand, the emitter (N+ BL) of the transistor Tr1 is a common emitter for both this memory cell and an adjacent memory cell, not shown, disposed below this memory cell. This emitter is connected through a contact hole 37 to the electrode 38. Practically, an electrode 38 is connected through a via hole to a second metal layer (bit line), which is omitted in FIGS. 12 and 13. The cathode contact of an SBD is connected through an N+ polycrystalline silicon layer 27 to the collectors of the transistors Tr1 and Tr2, which is shunted by an electrode 25 to reduce the voltage difference between the collectors. An N+ BL 50 is connected to a suitable power source at the end of the memory cell array.

Figure 14:
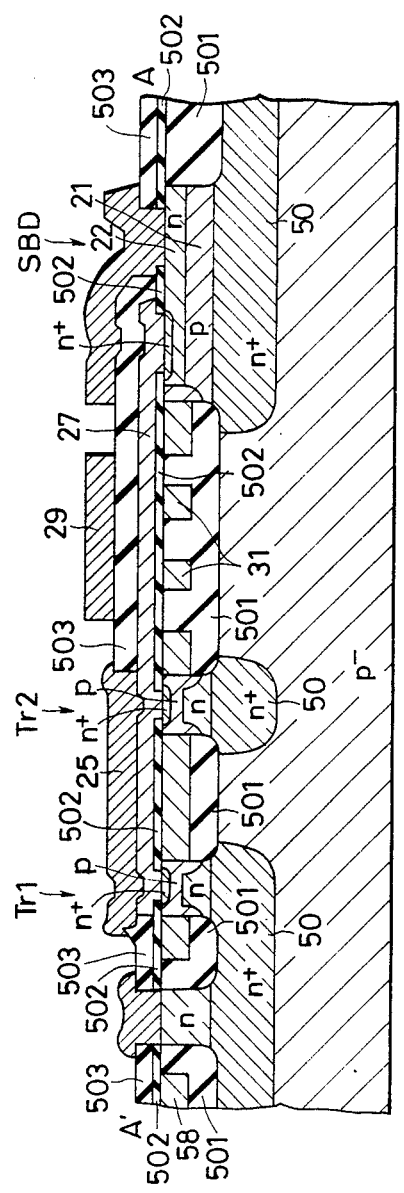
Figure 15:
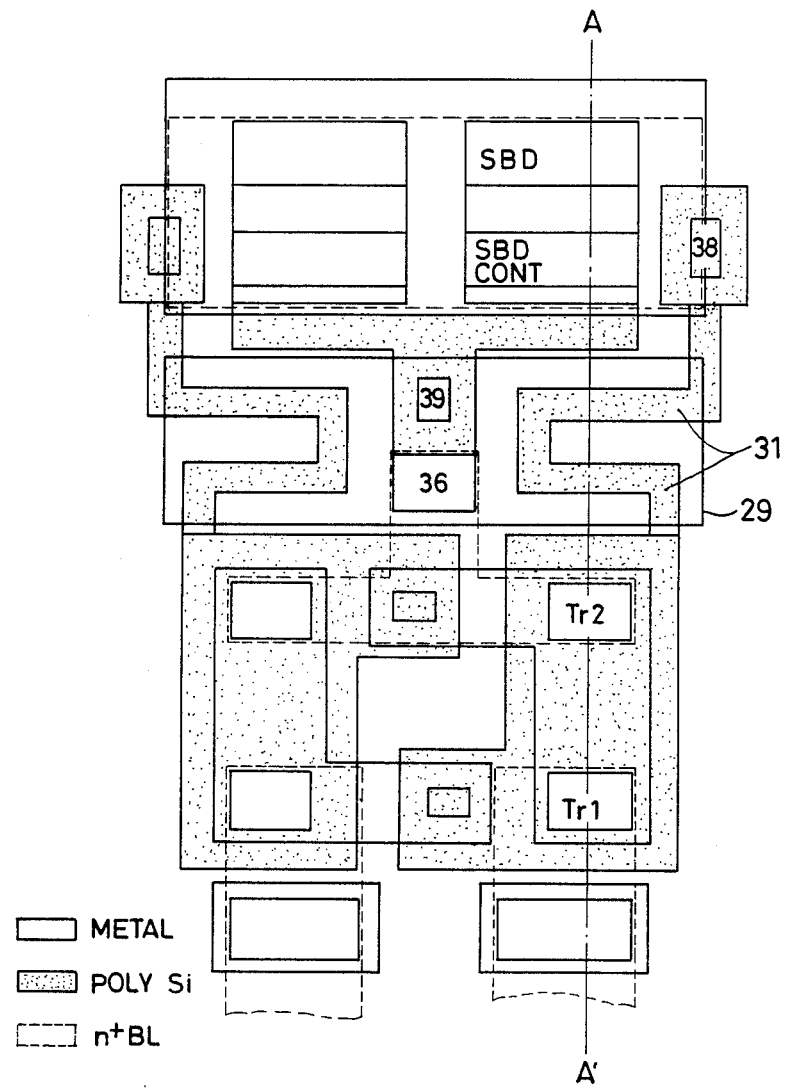

FIGS. 14 and 15 are a sectional view and a plan view, respectively, of an embodiment of the memory cell of FIG. 1C. This embodiment differs from the embodiment of FIGS. 12 and 13 only in that a resistor is connected in series to the SBD by properly designing the respective sheet resistances of the n type layer of the SBD and the N+ polycrystalline silicon layer 27 (in the embodiment of FIGS. 12 and 13, the voltage drop across this portion affects little to the operation of the memory cell, and hence the voltage drop is negligible), the p type layer 21 is not used for connecting the resistor 31 because it is possible that the n type layer 22 and the p type layer 21 are connected due to voltage drop across the n type layer 22, and the resistor 31 is connected directly to the word line by an electrode 38. In this embodiment, the p type layer 21 is held at a suitable potential (a potential that applies a reverse bias to the n type layers 22 and 20). The p type layer 21 is connected to the lower word line 29 by a contact 39 as illustrated in FIG. 15. The N+ BL 50 may be connected to a power source of an appropriate voltage so that the N+ BL 50 is in reverse bias relative to the potential of the lower word line 29. In FIG. 15, the N+ polycrystalline layer 27 is omitted for simplicity.

Figure 16:
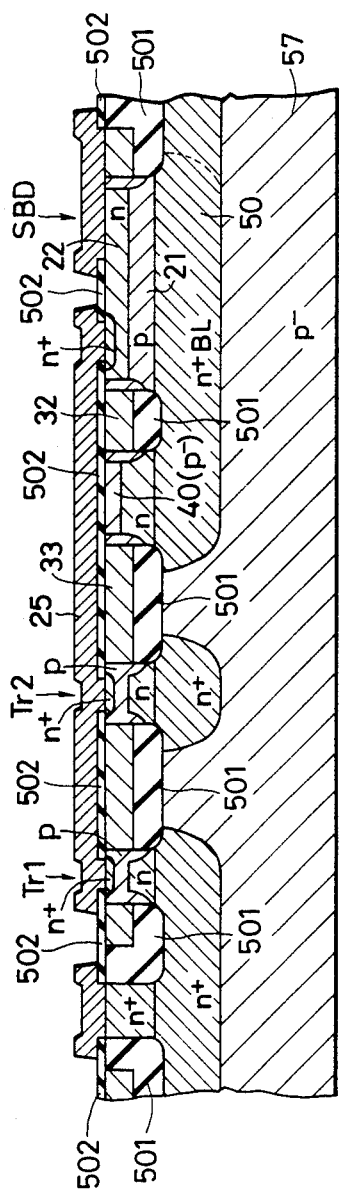

FIG. 16 illustrates a further embodiment having a resistor formed in a single crystal silicon instead of a polycrystalline silicon resistor 31 of the embodiment of FIG. 12. The resistor is formed in a p− layer 40 between a p+ polycrystalline silicon layers 32 and 33. In this embodiment, a metal layer is employed instead of an N+ polycrystalline silicon layer for rnterconnecting the cathode of the SBD and the collectors of the transistors.

Figure 17:
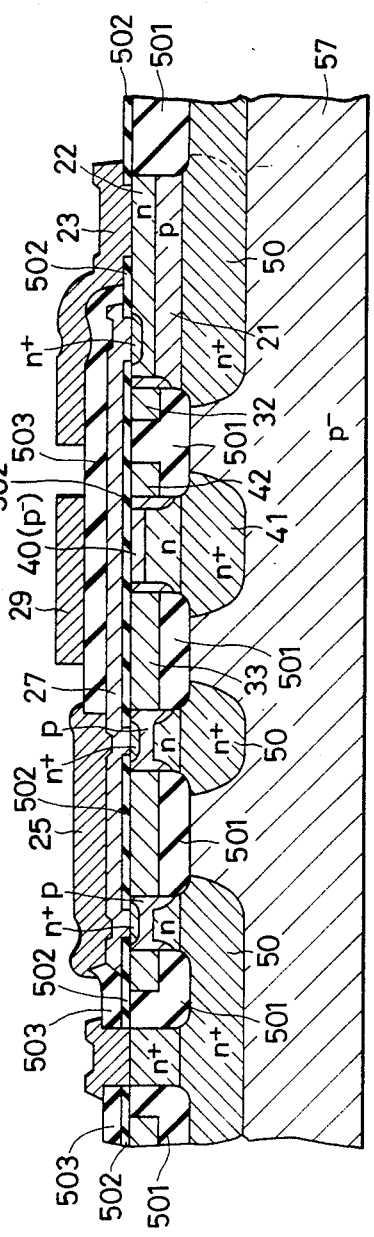

FIG. 17 illustrates an embodiment employing a p− single crystal silicon layer as a resistor instead of the polycrystalline silicon resistor employed in the embodiment of FIG. 14. A p− type layer 40 is formed between polycrystalline silicon layers 42 and 33 as a resistor. In this embodiment also polycrystalline silicon layers 32 and 42 are formed separately to prevent the junction from becoming conductive due to voltage drop across an n type layer 22. The polycrystalline silicon layer 42 is connected to a word line 23 in the same manner as that shown in FIG. 15. An N+ BL 41 and n+ Bd 50 are formed separately. The N+ BL 41 is held at a suitable potential for example, the word line potential for the polycrystalline silicon, layer 42, so that the p− layer 40 will not pinch off.

Figure 18:
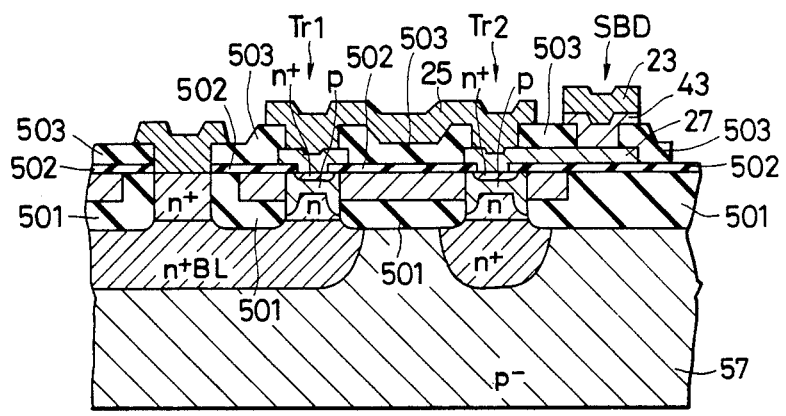

FIG. 18 illustrates an embodiment employing an SBD formed by a polycrystalline silicon layer and a metal electrode, namely, a layer of any metallic material, such as Al, AlSi, PtSi, Pd$_2$Si or W, which is capable of forming an SBD together with silicon. Apparently, noise current does not flow from the p− type substrate into this SBD. The SBD is formed by an electrode (word line) 23 and an n type polycrystalline silicon layer 43. An N+ type polycrystalline silicon layer 27 is doped with an impurity through ion implantation of diffusion to form the collector (an emitter in the conventional construction) of a transistor and to connect the cathode of the SBD to the collector of a transistor Tr2.

Figure 19:
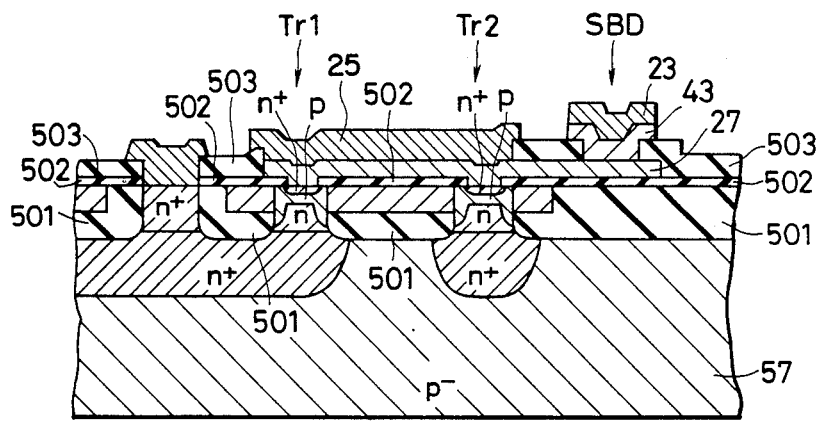

FIG. 19 illustrates a still further embodiment in which an N+ polycrystalline silicon layer 27 connects the cathode of an SBD to the collectors of two transistors Tr1 and Tr2.

Figure 20:
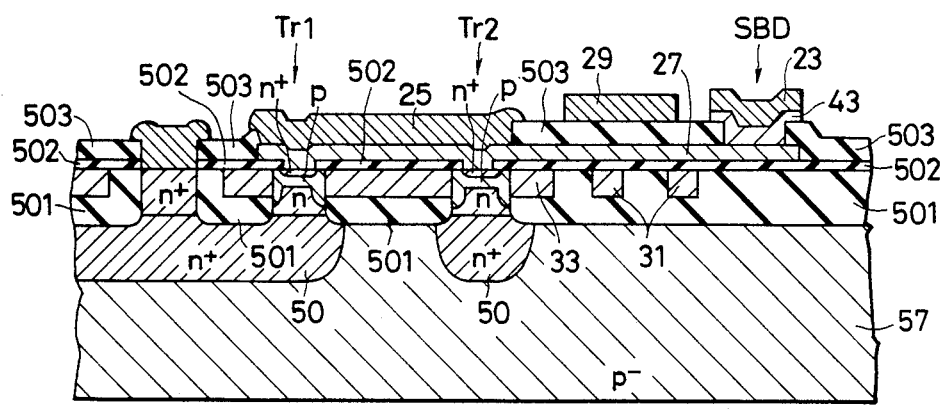

FIG. 20 illustrates an embodiment corresponding to the memory cell of FIG. 1C or FIG. 1B, employing a polycrystalline silicon SBD. For the memory cell of FIG. 1C, the shape and impurity concentration of an N+ polycrystalline silicon layer 27 is decided suitably (if necessary, the impurity concentration is changed locally) to connect a resistance in series to the SBD. On the other hand, a polycrystalline silicon layer 31 is formed to connect a resistance in parallel to the SBD. One end of the polycrystalline silicon layer 31 is connected through a polycrystalline silicon layer 33 to the bases of transistors Tr1 and Tr2, while the other end thereof is connected through a p+ polycrystalline silicon layer, not shown, to a word line 23 in the same manner as that shown in FIG. 15.

Figure 21:
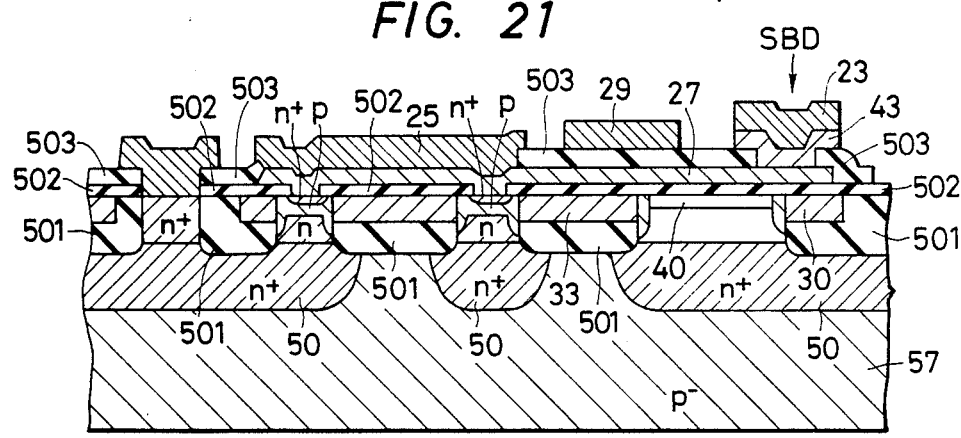

FIG. 21 illustrates an embodiment in which a resistance is formed by a p− single crystal silicon layer 40 instead of the polycrystalline silicon layer 31 employed in the embodiment of FIG. 20. The resistance is formed between a p+ polycrystalline silicon layers 30 and 33. The polycrystalline silicon layer 30 is connected to a word line 23. The mode of the connection is not shown.

Figure 22:
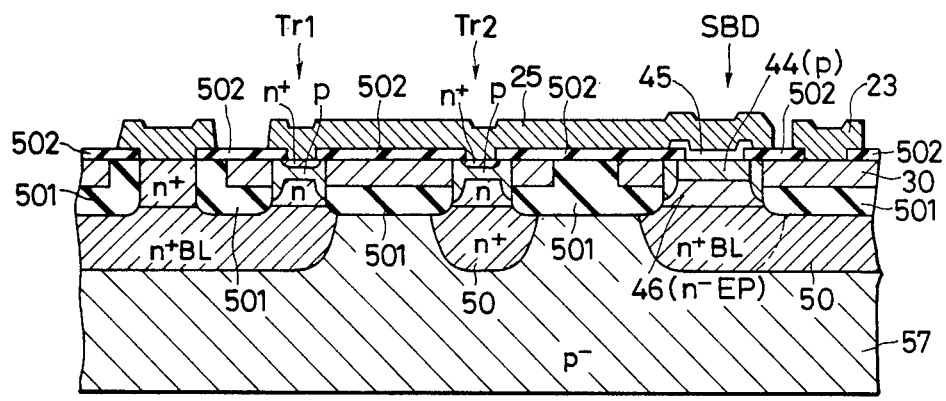

FIG. 22 illustrates an embodiment in which an SBD is formed between a p type silicon layer 44 and an electrode 45. The p type silicon layer 44 and the electrode 45 are the anode and cathode, respectively of the SBD. (Refer to J. M. Shannon, "Control of Schottky Barrier Height Using Highly Doped Surface Layers", Solid State Electronics, 1976, vol. 19, pp. 537–543, and J. M. Shannon, "Increasing the Effective Height of a Schottky Barrier Using Low Energy Ion Implantation", Applied Physics Letters, vol. 25, No. 1, 1 July, 1974, pp. 75–77.)

The p type silicon layer 44 is connected through a polycrystalline silicon layer 30 to a word line 23. The cathode 45 is connected through a metal layer 25 to the collectors of transistors Tr1 and Tr2.

Naturally, the cathode 45 may be connected to the collectors through an N+ polycrystalline silicon layer 27 as in the embodiment of FIG. 21.

Figure 23:
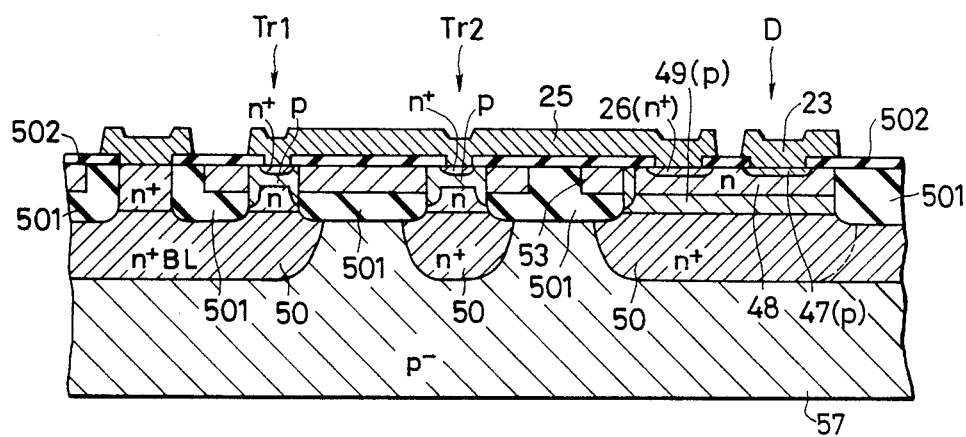

FIG. 23 is a sectional view of the memory cell of FIG. 1A. In FIG. 23, the resistances are not shown. The diode is formed across a p type region 47 and an n type region 48. The p type region 47, namely, the anode of the diode, is connected to the word line 23, while the n type region 48, namely, the cathode of the diode, is connected through an N+ contact region 26 and a metal layer 25 to the collectors of the transistors Tr1 and Tr2. Naturally, the metal layer 25 may be substituted by the N+ polycrystalline silicon layer employed in the embodiment of FIG. 21. This diode, similarly to the SBD of FIG. 10, is shielded from the noise current produced in the p− type substrate by a p type region 49 and an N+ BL 50. The region 49 and the N+ BL 50 are connected, similarly to the corresponding components of the embodiment of FIG. 10, to a conductor of a suitable potential to hold the connections between the n type region 48 and the p type region 49 and between the p type region 49 and the N+ BL 50 in reverse bias.

Figure 24:
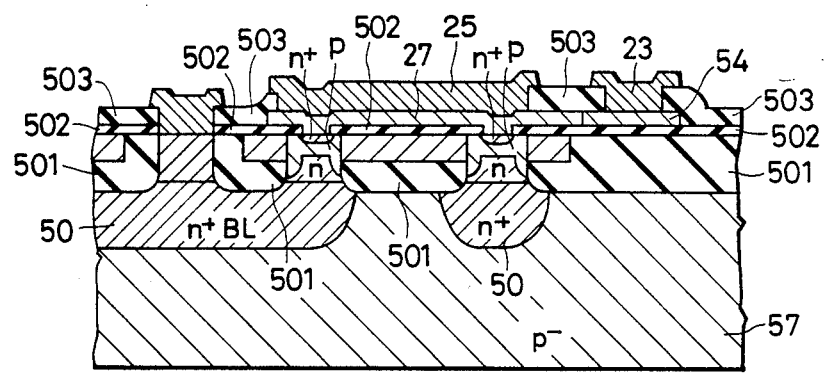

FIG. 24 illustrates a further embodiment in which a diode is formed across an n type polycrystalline silicon layer 27 and a p type polycrystalline silicon layer 54. In FIG. 24, the resistance is omitted for simplicity. Apparently, this memory cell is immune from alpha rays.

Figure 25:
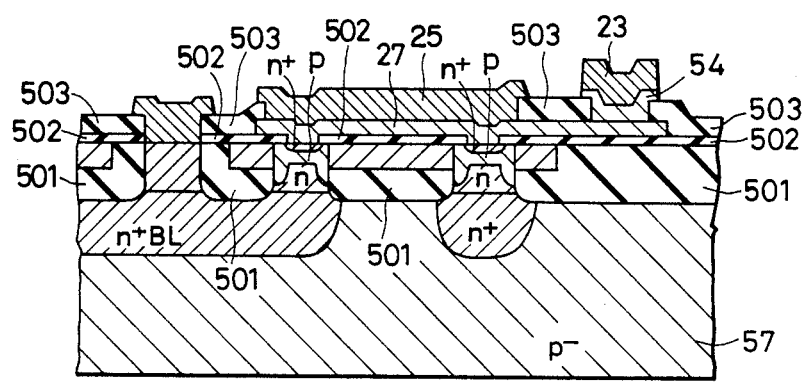

FIG. 25 illustrates further embodiment of the memory cell of FIG. 1B. In this embodiment, a diode is formed across a p type polycrystalline silicon layer 54 and an n type polycrystalline silicon layer 27. The functions of this memory cell is similar to those of the memory cell of FIG. 24.

Figure 1E:
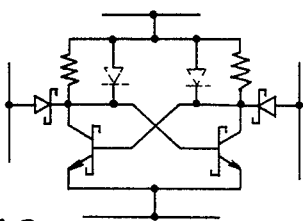

Although the embodiments of the memory cell of FIGS. 1A and 1E are not shown in the drawings, it is apparent from the foregoing description that the memory cells of FIG. 1A and 1E can be easily embodied similarly to those described hereinbefore.

It is obvious to those skilled in the art that memory cells of any type other than those illustrated in FIGS. 1A to 1E, such as a memory cell having only load resistances and a memory cell having, in combination, diodes and resistances, can be constructed through the combinations of the embodiments described hereinbefore.

As apparent from what has been described hereinbefore, the present invention provides device constructions which, basically, has high immunity from radiation. Particularly, the present invention has the remarkable effect of preventing soft error attributable to radiation such as alpha rays.

Figure 26:
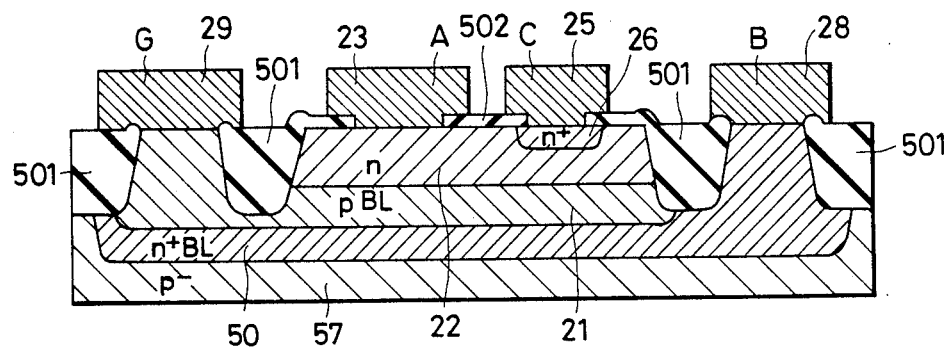

A modification having the highest immunity from alpha rays among the modifications of the second embodiment of the present invention will be described hereinafter with reference to FIG. 26. In this modification, an SBD is formed by an n type epitaxial layer 22 and a p type BL 21 formed over the n type BL 50. The p type BL 21 is connected to an electrode 29 for external connection.

A Schottky barrier is formed at the junction of an n type epitaxial layer 22 and a metal electrode 23. A cathode 25 is in ohmic contact with a high-concentration n type region 26. The n type BL 50 is connected to a metal electrode 28 for external connection. A fixed voltage is applied through a metal electrode 28 to the n type BL 50. A fixed voltage is applied through a metal electrode 29 to the p type BL 21. In the SBD, forward current flows from the metal electrode 23 to the metal electrode 25 (from A to C in FIG. 26). The SBD and the substrate 57 are independent from each other in potential. Therefore, when a noise signal produced within the substrate is transmitted toward the SBD, the BLs 21 and 50 absorb the noise signal, and hence the potential of the SBD remains unchanged and the SBD is unaffected by the noise signal. Accordingly, the SBD is immune from the noise signal produced within the substrate.

Figure 27:
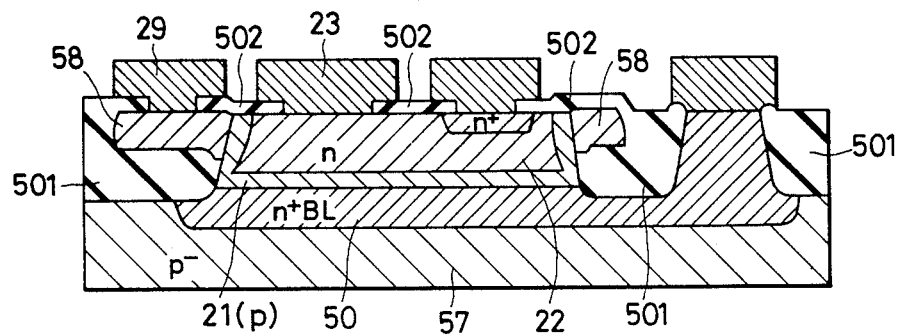

FIG. 27 is a sectional view showing the sectional construction of another embodiment of the present invention. In this embodiment, a polycrystalline silicon layer 58 is formed as an electrode for connecting a p type BL to an external circuit for the microminiaturization of the device. A basic construction of a transistor employing polycrystalline silicon layers is disclosed in Japanese Unexamined Patent Publication No. 56-1556. In this embodiment, an SBD is formed in a convex single crystal region and a polycrystal layer is formed in direct contact with the side wall of the convex single crystal region. The polycrystal layer is connected, as a p type conductive layer, to a p type BL 21. Thus, the area of the p type BL 21 is smaller than that of FIG. 26, which contributes to the microminiaturization of the device. Furthermore, since a polycrystal layer formed over a thick oxide film 501 is used as an electrode for external connection, the stay capacitance is reduced, which brings about low powe consumption and high-speed operation of the device.

Figure 28A:
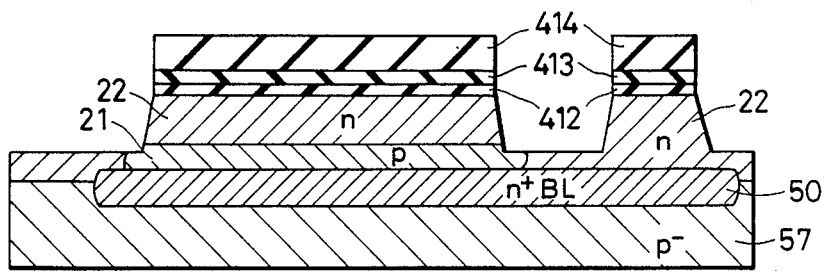
Figure 28B:
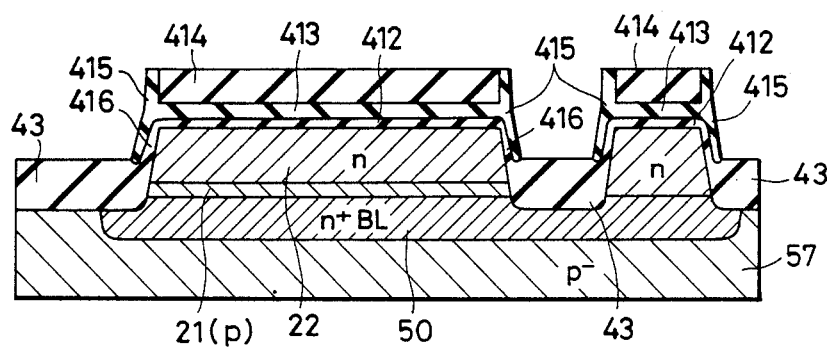
Figure 28C:
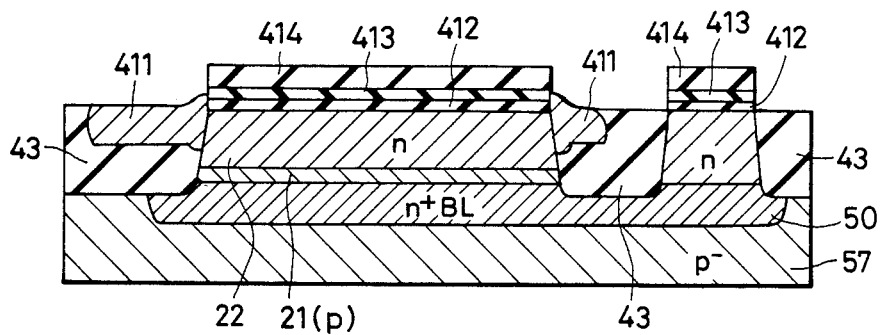
Figure 28D:
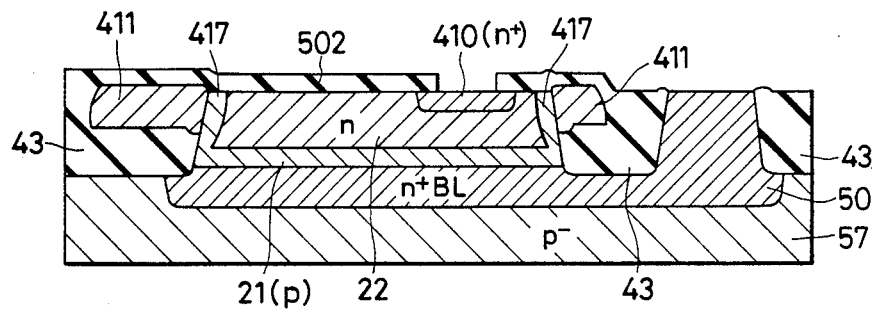
Figure 28E:
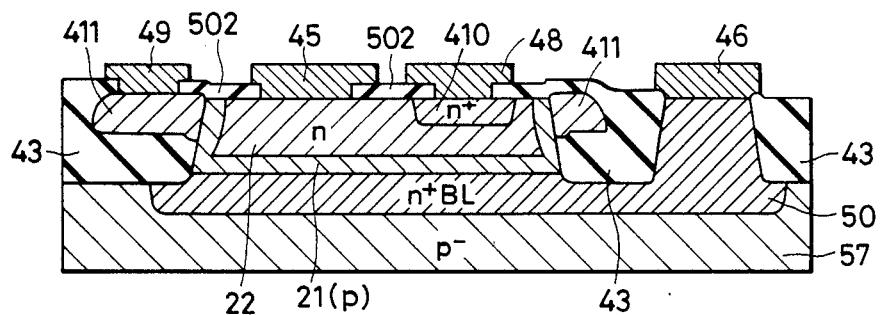

FIGS. 28A to 28E are sectional view showing the processes of manufacturing the SBD of the embodiment. A p type substrate 57 is subjected to n type diffusion and p type diffusion to deposit an n type epitaxial layer 22 thereon. The diffused layer includes an n type BL 50 and a p type BL 21. The impurity concentration of the n type epitaxial layer 22 is controlled through the ion implanting process or the like so that a preselected forward voltage $V_F$ appears. Then, an oxide film 412, a silicon nitride film 413 and an oxide film 414 are deposited one over the another on the epitaxial layer 22. Then, the epitaxial layer 22, the oxide film 412, the silicon nitride film 413 and the oxide film 414 are subjected to photoetching to form a convex region for forming an SBD and a convex region for reaching an n type BL as illustrated in FIG. 28A. After heat-oxidizing the entire area of the silicon surface layer to form an oxide film, a silicon nitride film is deposited over the oxide film. Then the silicon nitride film is subjected to the reactive sputter etching process employing $CF_4$ for unisotropical etching to form silicon nitride films 415 over the side walls of the convex regions. Then, this laminated structure is subjected to selective oxidation to coat the entire surface of the convex regions with a thick oxide film 43 as illustrated in FIG. 28B. Then, the silicon nitride films 415 and the oxide films 416 are removed from the side walls of the convex regions, a p type polycrystalline silicon layer is deposited and only the polycrystalline silicon layers deposited over the respective top surfaces of the convex regions ar removed. Then, the entire surface of the polycrystalline silicon layer except the region for forming the SBD is oxidized to form a thick oxide film as shown in FIG. 28C. When the polycrystalline silicon layer 411 is oxidized, the p type impurity contained in the polycrystalline silicon layer diffuses into the convex single crystal layer to form a p type region 417 which is joined to the p type BL 21. A hole is formed in the oxide film formed over the surface of the convex region and an n type impurity is diffused into the n type epitaxial layer 22 to form an n type layer 410 having a high impurity concentration as shown in FIG. 28D. Holes are formed in the oxide films formed over the polycrystalline silicon layer 411 and the convex region and in the n type BL connecting region, metal electrodes are deposited through evaporation, and then the laminated structure is subjected to photolithographic process for patterning so that an SBD construction as illustrated in FIG. 28E is obtained.

Figure 29:
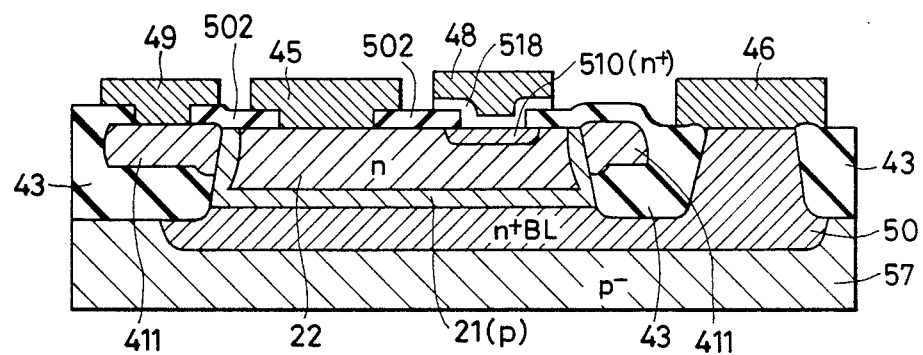

FIG. 29 illustrates the sectional construction of a fourth embodiment of the present invention. This embodiment has a polycrystalline silicon layer 518 to form a thin n type region 510 having a high impurity concentration through ion implantation. The polycrystalline silicon layer 518 is formed to prevent crystal defect due to the alloying of a metal electrode 48 and a convex single crystal layer.

Figure 30:
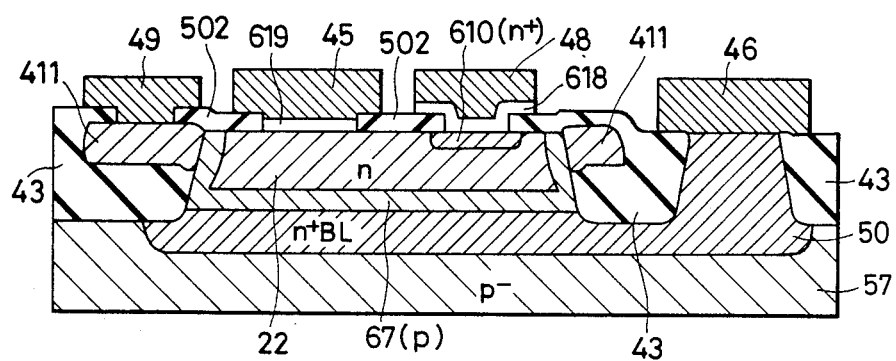

FIG. 30 illustrates the sectional construction of a fifth embodiment of the present invention. In this embodiment, a metal silicide layer 619 is formed between an n type epitaxial layer 22 and a metal electrode 45 to enable the precision control of the threshold voltage. Applicable metal silicides are tungsten silicide, platinum silicide, palladium silicide, and tantalum silicide and the like.

As described hereinbefore, according to the present invention, an n type BL and a p type BL are formed between an SBD and a substrate to isolate the SBD from the substrate so that the noise signal produced within the substrate will not affect the SBD. Accordingly, the present invention provides a very high density integrated SBD.

Naturally, the effect of the present invention remains unchanged even if the p type and the n type are inverted.

Figure 31:
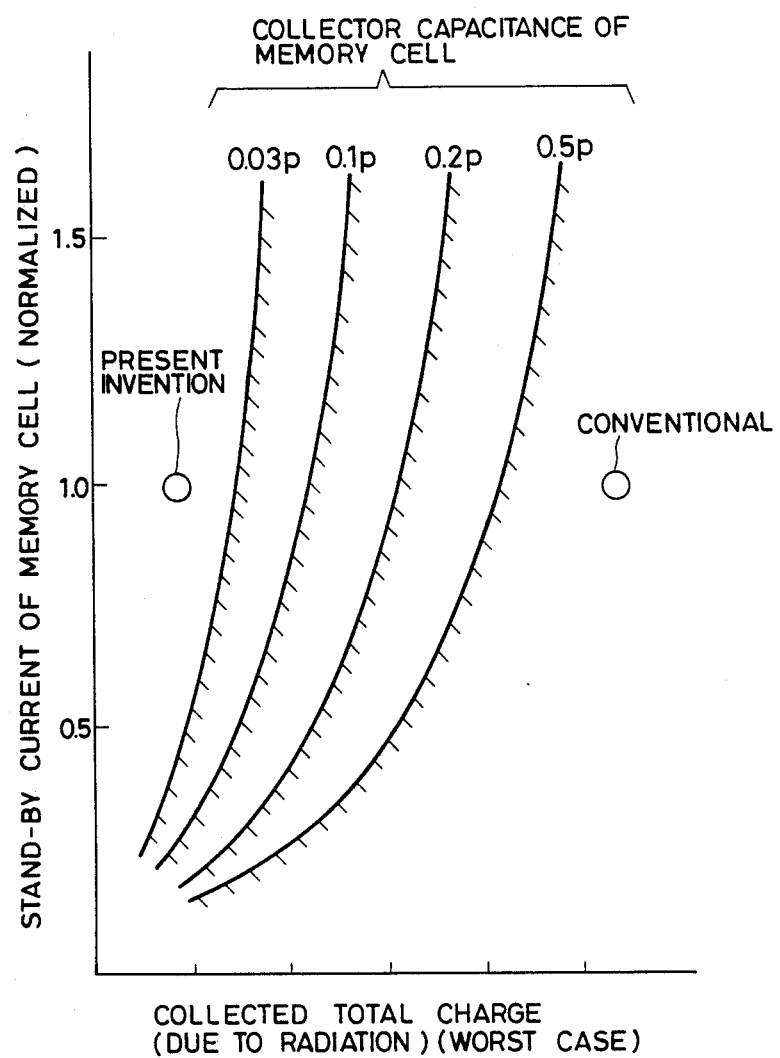

FIG. 31 is a graph of assistance in explaining the effect of isolating the load and the coupling device from the substrate according to the present invention on the improvement of the immunity of the memory cell from radiation.

Figure 4A:
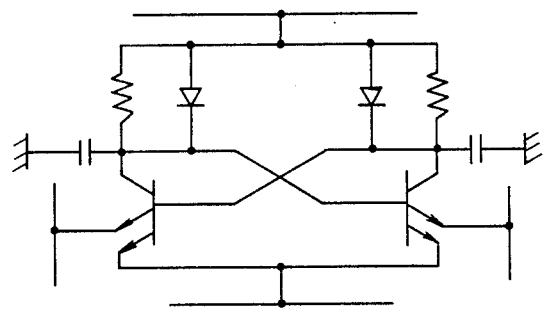
Figure 4B:
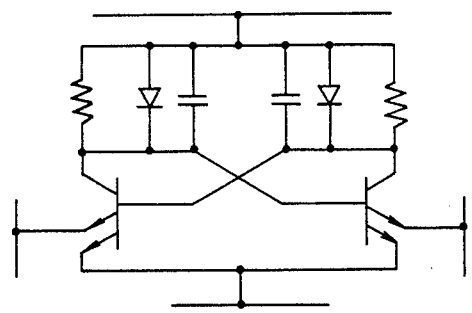
Figure 4C:
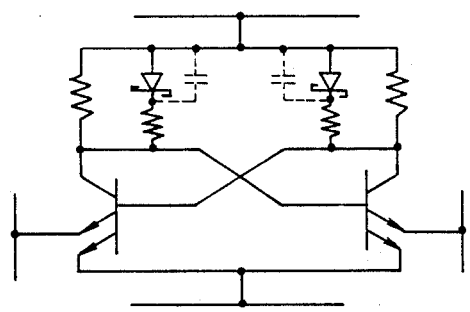

As apparent from FIG. 31, when a prior art memory cell, for example, the memory cell of FIG. 4B, is exposed to the worst radiation noise current condition, soft error occurs in the memory cell even when the collector of the memory cell is provided with a capacitance of 0.5 pF, whereas the memory cell of the present invention (a memory cell equivalent to that of FIG. 8B) is immune from such a noise current and soft error does not occur therein even though the memory cell has only a natural parasitic capacitance the value of which is dependent on the layout thereof and is in the range of 0.03 to 0.05 pF.

Embodiment 3:

Bipolar memory cells, in a third embodiment of the present invention, each provided with pnp transistors as loads, namely, so-called pnpn type memory cells, will be described hereinafter. The pnp transistors and npn transistors are inverted.

Also described herein is a bipolar memory cell having load pnp transistors provided with shields, respectively, to prevent the intrusion of electrons from the substrate into the device.

Examples of the third embodiment have a higher density of integration than that of the second embodiment.

Figure 32:
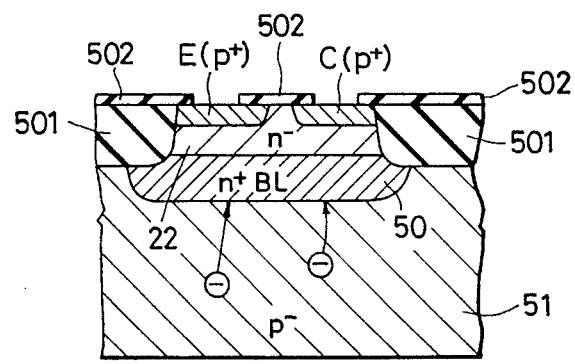
FIGS. 32 through 47 are illustrations of assistance in explaining constructions of memory cells employing shield pnp transistors as loads, respectively.

FIGS. 1F to 1I illustrate memory cells having cross-connected pnpn switches (thyristors) each consisting of a pnp transistor and a npn transistor. According to the present invention, the npn transistor is inverted. According to the prior art, when a forward npn transistor is employed, a lateral transistor as illustrated in FIG. 32 is employed to construct a compact memory cell. Naturally, such a pnp transistor may be employed in the present invention. Since the radiation noise current does not flow in the collector of the npn transistor, the employment of such a pnp transistor improves the immunity from radiation of the memory cell accordingly. However, since the noise current flows toward the base of the pnp transistor and, finally, flows into the collector node of the memory cell, it is possible that soft error occurs. That is, since part of the base of the pnp transistor (lateral pnp transistor) of the conventional memory cell is an N+ BL, the electrons gathered in the N+ BL (pnp base) finally gather in the collector node of the npn transistor (pnp base is connected to the npn collector), it is impossible to enhance the immunity from radiation remarkably when only the npn transistor is inverted. Naturally, the immunity from radiation is improved by a degree corresponding to the reduction of the amount of electrons that gather in the collector of the npn transistor. Accordingly, it is desirable that the pnp transistor is shielded from the noise current produced in the substrate by radiation. The pnp transistor having such a construction will be described afterward. When a pnp transistor isolated from the substrate is employed, a noise current is produced only by the electric charge produced only within the active area (npn and pnp transistor regions) and the intensity of the noise current is, similarly to the memory cells of FIGS. 8A to 8F employing loads and coupling devices which are shielded from the substrate, at the worst, approximately one-tenth of the intensity of the noise current produced within the substrate. The memory cells of FIGS. 1G to 1I employ SBDs. Naturally, it is desirable that the SBDs are shielded, as those of FIGS. 8A to 8F, from the substrate so that the electric charge produced by radiation will not affect the SBDs.

This embodiment is a cross-connection pnpn memory cell having a construction in which the npn transistor is inverted and the gathering of electric charge produced within the substrate in the base (connected to the collector of the npn transistor) and the collector (connected to the base of the npn transistor) of the pnp transistor.

Figure 1F:
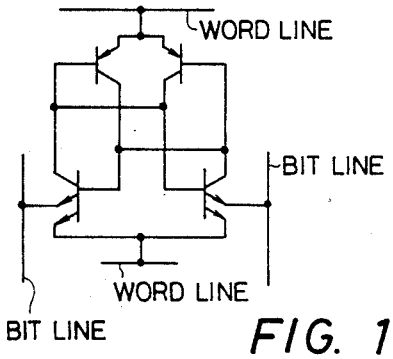
Figure 33:
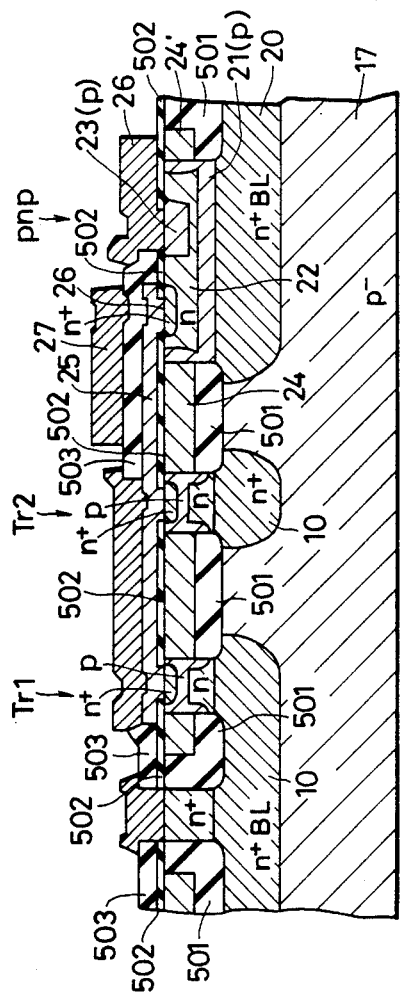
Figure 34:
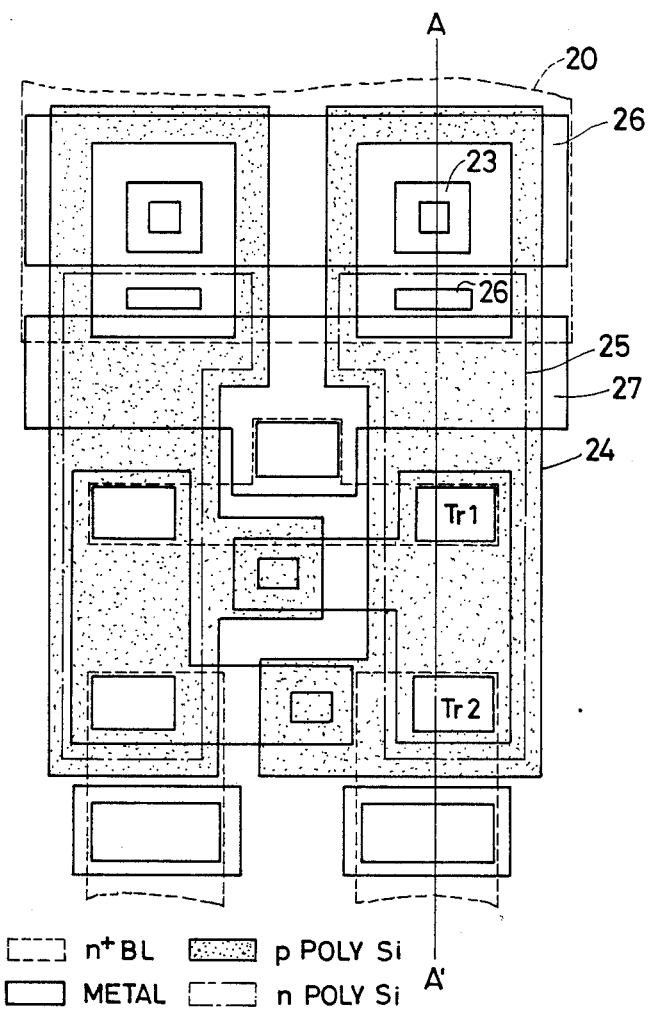

FIGS. 33 and 34 are a sectional view and a plan view, respectively, of a memory cell corresponding to that of FIG. 1F. As mentioned above, npn transistors Tr1 and Tr2 are inverted and N+ BLs 10 and 10' serve as emitters, respectively. A pnp transistor consists of a p type emitter region 23, an n type base region 22 and a p type collector region 21, and functions as a vertical pnp transistor. An N+ BL 20 is connected to a power source which always keeps the junction potential between the N+ BL 20 and the collector region 21 in reverse bias. Accordingly, the electric charge gathered in the N+ BL 20 is grounded through the power source and does not reach the base or the collector of the pnp transistor. Therefore, the combination of the inverted npn transistors and this pnp transistor prevents the electric charge produced within the substrate due to radiation from gathering in the collector node of the memory cell, so that the immunity of the memory cll from soft error attributable to the incidence of radiation is enhanced remarkably. The base of the pnp transistor is connected through an N+ BL 26 and an N+ type polycrystalline silicon layer 25 to the collectors of the npn transistors Tr1 and Tr2, however, this connection may be made by other means, such as an aluminium wiring. The lead of the collector of the pnp transistor, p type polycrystalline silicon layers 24 and 24' surrounds the n type base region a shown in FIG. 34. The p type polycrystalline silicon layers 24 and 24' are the same. The emitter region 23 is connected to an upper word line 26.

The layout of the memory cell of FIG. 33 is shown in FIG. 34. FIG. 33 is a sectional view taken along line A—A' of FIG. 34. As illustrated in FIG. 34, the right-hand and left-hand transistors of the memory cell are interconnected in cross onnection through the connection of metal electrodes extended to an isolation region between the transistors from the right and left sides thereof and the p type polycrystalline silicon layer.

Figure 35:
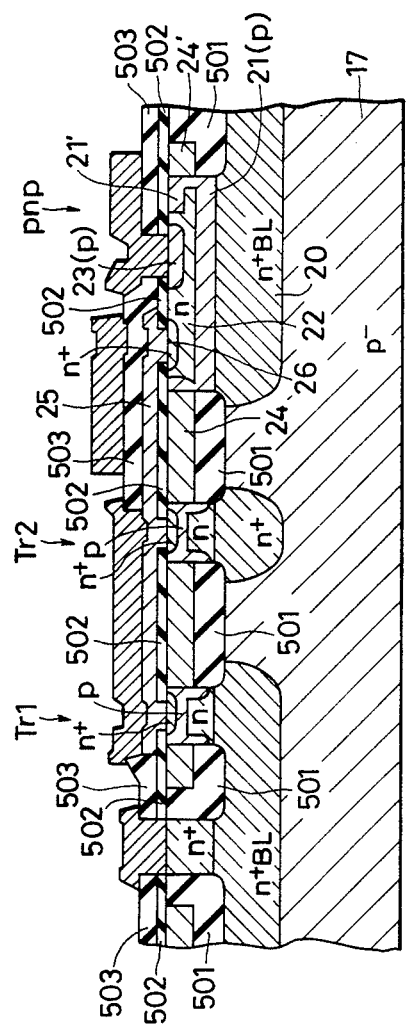
Figure 36:
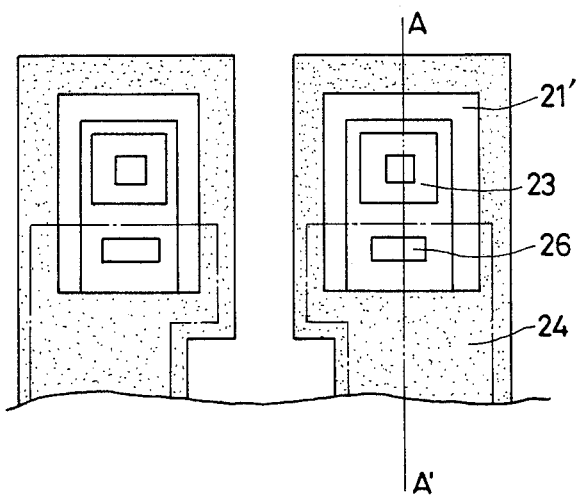

A memory cell illustrated in FIG. 36 has a pnp transistor expected to function as a lateral pnp transistor. As illustrated in FIG. 36, a collector region 21' is formed so as to surround a p type emitter region 23, except that only one side thereof is open to lead out a base contact 26. Generally, when a vertical pnp transistor is formed, as illustrated in FIG. 33, it is difficult to control the base width between the p type collector region formed directly above the N+ BL and the p type emitter region 23, and hence it is difficult to control the characteristics of the vertical pnp transistor. On the other hand, when a lateral pnp transistor is formed as illustrated in FIG. 35, since the width of the base region between the type collector region 21' and the p type emitter region 23 is defined with a photomask, the characteristics of the lateral pnp transistor can be comparatively easily controlled. Furthermore, in the memory cell of FIG. 35, the pnp transistor functions mainly as a lateral transistor, however, the same is able to function also as a vertical pnp transistor and the npn transistor may function as both vertical and lateral pnp transistors or may function principally as a vertical pnp transistor and subordinately as a lateral pnp transistor.

Figure 1G:
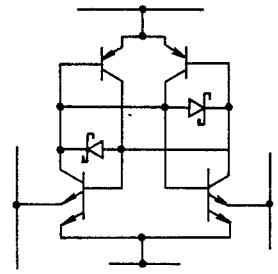
Figure 1H:
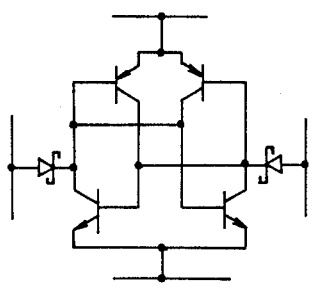
Figure 37:
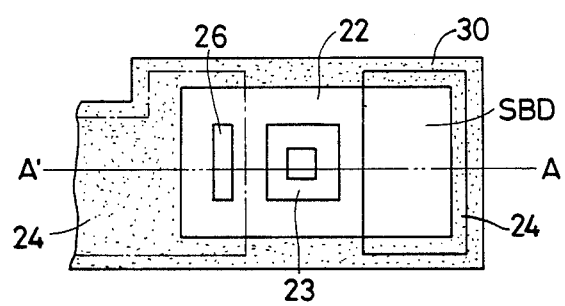
Figure 38:
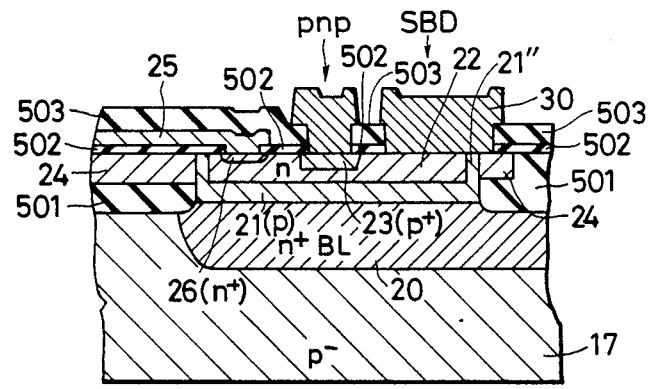

FIGS. 37 and 38 illustrate a memory cell, in which an SBD for the memory cell of FIG. 1G or 1H is provided between the n type base region 22 of a pnp transistor and a metal electrode 30. In this embodiment, the SBD is inserted between a polycrystalline silicon layer 24' and the n type base region 22, which is suitably applicable to the memory cell of FIG. 1G. When the SBD is applied to the memory cell of FIG. 1H, the anode of the SBD is disconnected from the collector of the pnp transistor. Concretely, the size of the contact hole of the SBD is reduced so that an electrode 30 will not be in contact with the polycrystalline silicon layer 24' and a p type silicon region 21''. In order to provide the SBD with desired characteristics, the impurity concentration of the n type base region 22 may be varied from portion to portion so that the impurity concentration of a portion below the electrode 30 and that of a portion below the p+ type emitter region 23 are different from each other. When such a impurity concentration distribution is desired, the impurity is implanted individually into the portion below the electrode of the SBD and the portion below the emitter of the pnp transistor through ion implantation.

Figure 39A:
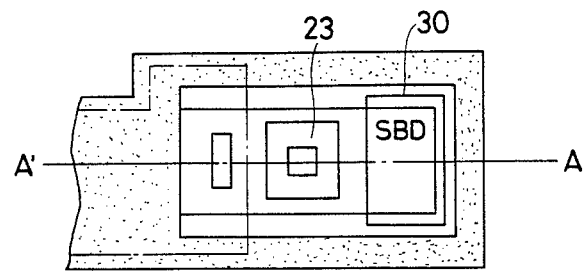
Figure 39B:
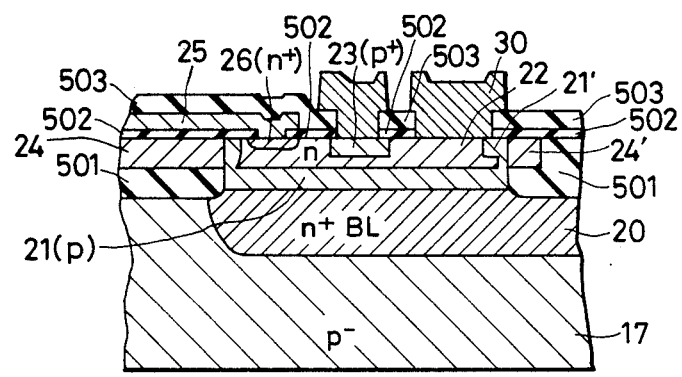

FIGS. 39A and 39B illustrate a memory cell in which an SBD is connected to the base and collector of a pnp transistor which functions principally as a lateral pnp transistor as that of FIGS. 35 and 36. In this memory cell, the anode of the SBD and the collector of a pnp transistor are connected to a p type region 21', however, the size of the contact hole 30 of the SBD may be increased to connect the anode of the SBD and the collector of the pnp transistor to a p type polycrystalline silicon layer as well as to the p type region 21'. On the contrary, when the size of the contact hole 30 is reduced to disconnect the anode of the SBD from the p type polycrystalline silicon layer, the SBD is applicable to the memory cell of FIG. 1H as that of the SBD of the memory cell of FIGS. 37 and 38. The SBDs of the memory cells of FIGS. 37, 38, 39A and 39B are shielded with N+ BLs connected to a power source, and hence the noise current produced within the p− substrate by radiation does not flow into the anode and cathode of each SBD. Thus the addition of the SBD improves the immunity of the memory cell from radiation remarkably.

Figure 1I:
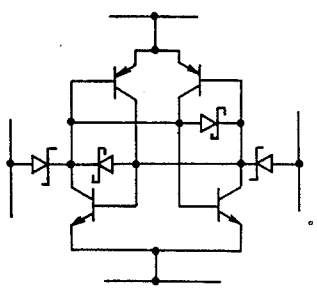
Figure 2:
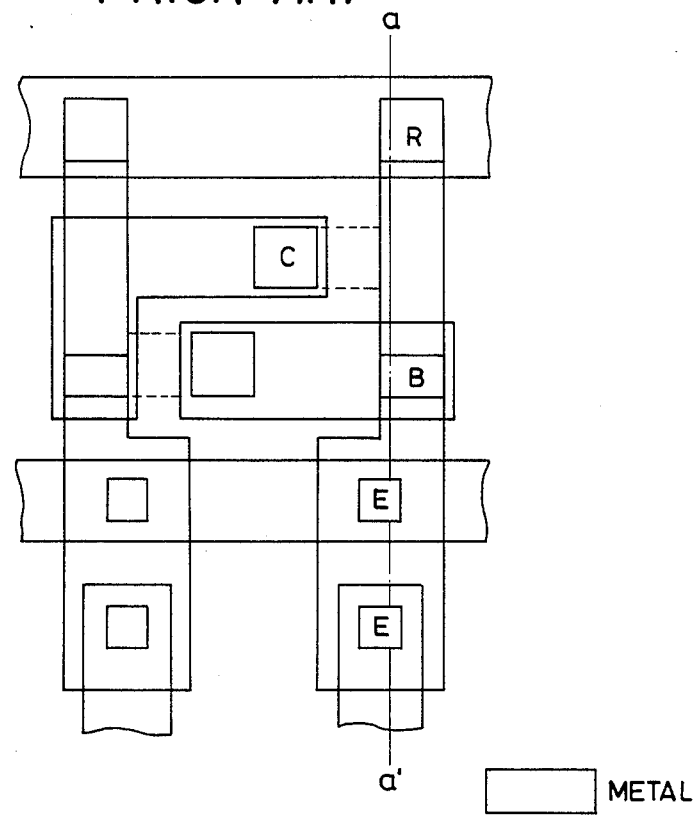
Figure 40:
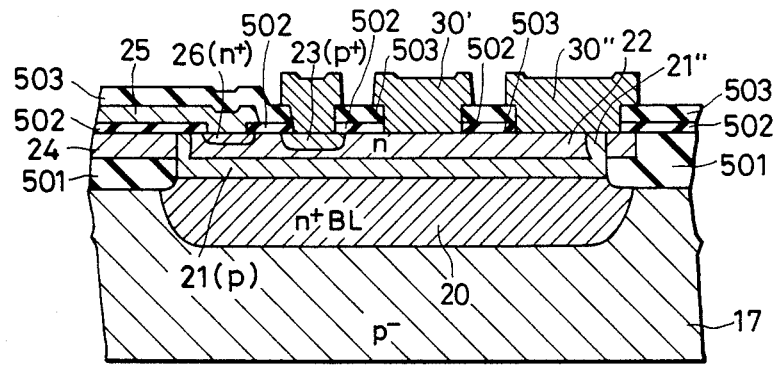

FIG. 40 illustrates a memory cell equivalent to that of FIG. 1I, in which two SBDs 30' and 30'' are formed in the base region 22 of a pnp transistor. The SBD 30' is connected to a bit line, while the SBD 30'' is used for preventing the saturation of the memory cell transistor and the anode thereof is connected to a p type collector region. In the memory cell of FIG. 40, a base contact 26, a emitter 23, the SBD 30' and the SBD 30'' are arranged in a line in this order, however, they are not necessarily arranged neither in that order nor in a line and their relative positions are optional depending on the layout of the memory cell.

Figure 41:
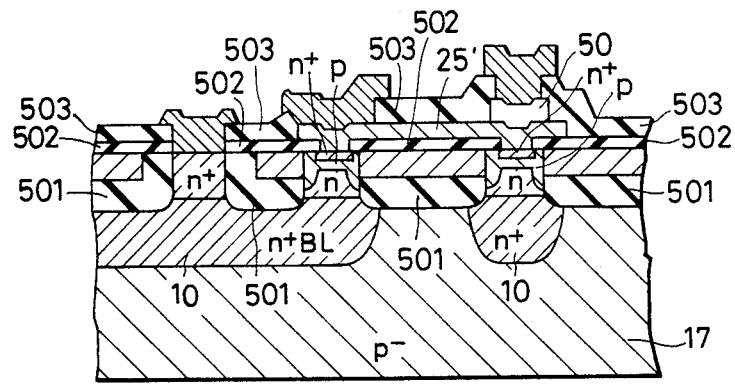

Embodiments in which a pnp transistor is formed in a silicon substrate has been described hereinbefore, however, it is possible to form a pnp transistor outside a silicon substrate through the most advanced manufacturing technique. FIG. 41 illustrates a memory cell in which a pnp transistor is formed outside a silicon substrate. In this memory cell, the polycrystalline silicon layer 25 employed in the memory cell of FIG. 34 is processed with a laser ray or the like to form an n type single crystal silicon layer 25', a p type single crystal silicon layer 50 is formed on the n type layer 25' and the n type layer 25' is coupled with an npn transistor formed below the n type layer 25' to construct a pnpn transistor. Since the pnp transistor of this memory cell is formed above the substrate, the pnp transistor is not affected by a noise current produced within the substrate. In this memory cell, the collector and base regions of the npn transistor serves also as part of the base and the collector of the pnp transistor. However, it is also possible to form the pnp transistor above the substrate. It is apparent to those skilled in the art that the present invention is applicable to various memory cells employing various pn transistors formed over the substrate, respectively.

As described hereinbefore, combining inverted npn transistors and a shield pnp transistor almost completely prevents the accumulation of the radiation noise charge in the collector node or the base node of the memory cell. Thus the present invention enhances the immunity of the memory cell from radiation remarkably without providing any capacitance and provides a compact memory cell.

The construction and a process for manufacturing the shield pnp transistor employed in the above-mentioned memory cell will be described hereinafter with reference to FIGS. 42 and 43A to 43D.

Figure 42:
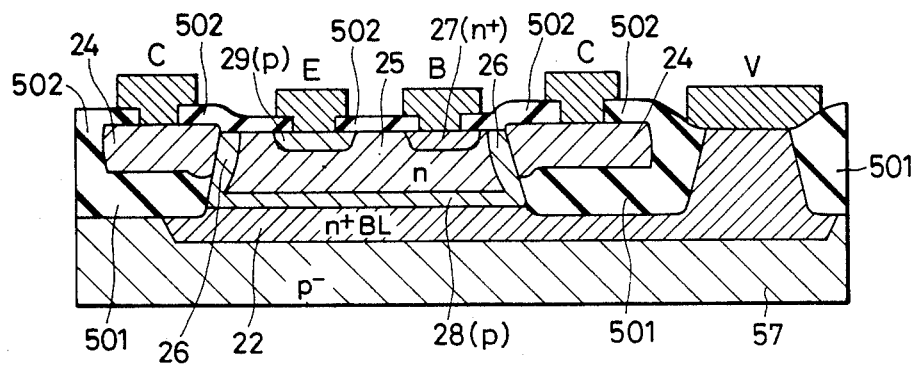

Referring to FIG. 42, a p type buried layer 28 is formed over an n type buried layer 22. The p type buried layer 28 is connected to a p type region 26 formed by diffusion through a p type polycrystalline silicon layer 24 formed over a buried oxide film 501 to form a collector region. A metal layer C is a collector electrode formed in contact with the polycrystalline silicon layer 24. An n type layer 25 surrounded by the collector region is a base region. A base electrode B is formed on an n type layer 27 having a high impurity concentration formed within the base region. A p type region 29 is an emitter region which is formed by diffusion through the surface of the substrate.

In this embodiment, the emitter region 29, the base region 25 and the collector region 28 constitute a vertical pnp transistor. Since the emitter region is formed by diffusion through the surface of the substrate, and hence the gap between the emitter region and the collector region can be easily adjusted by appropriately adjusting the duration of the diffusion process, the width of the base can be easily adjusted. Since the base electrode B is formed near the emitter electrode E within the same single crystal silicon layer, the parasitic capacitance of the base is small as compared with that of the conventional construction. The n type buried layer 22 is connected to an electrode V; and the substrate 57 and the vertical transistor can be electrically isolated from each other by applying a fixed voltage to the electrode V. That is, the n type buried layer 22 is electrically shielded from the vertical transistor Thus, the width of the base can be easily adjusted, the base has a small parasitic capacitance and the noise signal produced within the substrate is absorbed by the n type buried layer.

A process for manufacturing the shield pnp transistor described with reference to FIG. 42 will be described hereinafter with reference to FIGS. 43A to 43D.

Figure 43A:
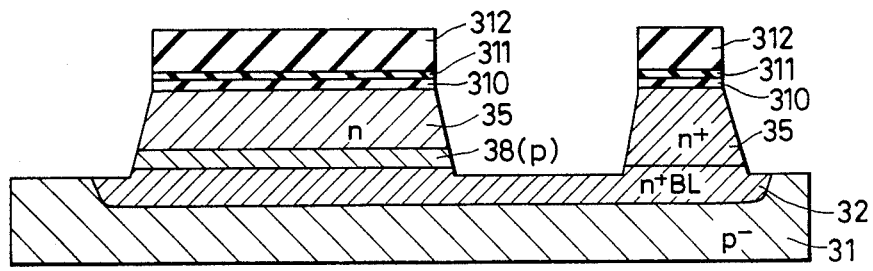
Figure 43B:
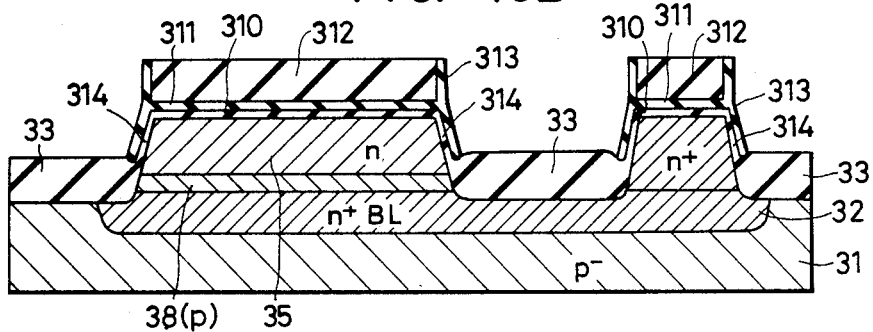
Figure 43C:
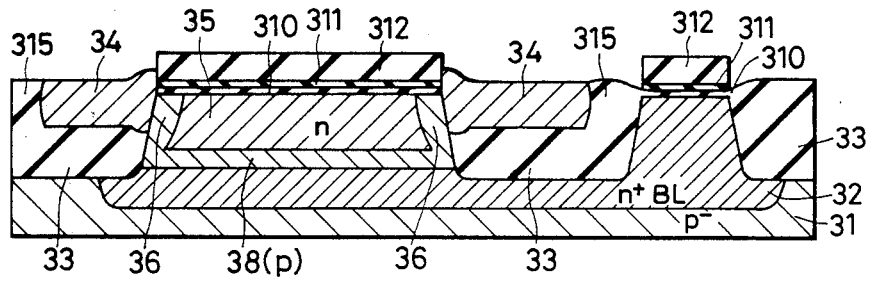
Figure 43D:
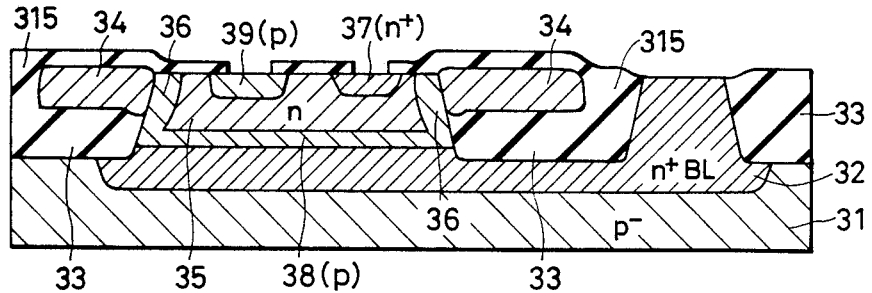

An n type layer 32 is formed over a p type substrate 31, and then a p type layer 38 is formed in a desired region through the ion implantation process. An n type epitaxial layer 35 is deposited over the p type layer 38 and the n type layer 32, and then an oxide film 310, a silicon nitride film 311 and an oxide film 312 are formed over the n type epitaxial layer 35. Then, the laminated structure is subjected to an etching process to etch the layers of the films 310, 311 and 312 and the n type epitaxial layer 35, except a region for constituting a transistor and an n type buried layer connecting region as illustrated in FIG. 43A. Then, the laminated structure is subjected to a hot oxidation process. Then, a silicon nitride film is deposited over the entire surface of the laminated structure, and then the laminated structure is subjected to a reactive sputter etching process for unisotropical etching to form a thick oxide films 33 over the entire surface of the laminated structure except the silicon nitride films 313 surrounding the convex single crystal regions as illustrated in FIG. 43B. Then, the silicon nitride film 313 and the oxide film 314 formed over the side walls of the convex single crystal regions are removed, then a p type polycrystalline silicon layer 34 is deposited, then only the p type polycrystalline silicon layer 34 deposited on top of the convex single crystal regions is removed, then the p type polycrystalline silicon layer except a portion which is to be used as a transistor region is oxidized to form a layer 315. During the heat process, part of the impurity contained in the polycrystalline silicon layer is diffused into the n type single crystal layer 35 to form a p type region 36 which connects the p type buried layer 38 to the p type polycrystalline silicon layer 34 as illustrated in FIG. 43C. Then, the oxide film 312 is removed and the surface layer of the p type polycrystalline silicon layer 34 is oxidized, and then the silicon nitride film 311 is removed. Then, a p type emitter region 39 and an n type region 37 having a high impurity concentration are formed in the n type single crystal layer 35 through diffusion. Contact holes are formed in the layer 315 at positions corresponding to the p type emitter region 39 and the n type region 37, respectively (FIG. 43D), and electrodes are formed in the contact holes. Thus the pnp transistor of FIG. 42 is completed.

Figure 44:
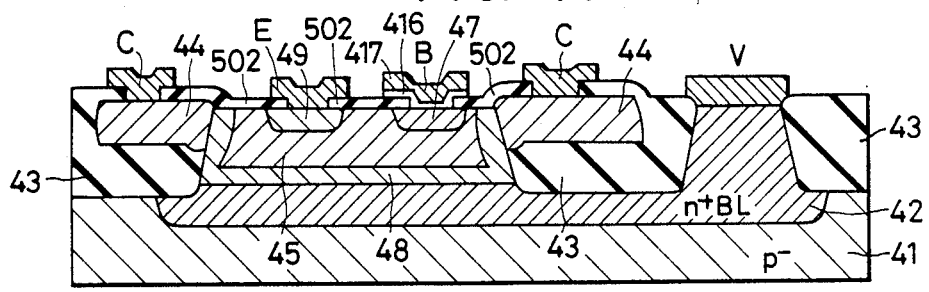

FIG. 44 illustrates a further transistor embodying the present invention. In this transistor, a buffer layer 416 is formed over an n type base connecting region 47 having a high impurity concentration to obviate the direct reaction between a metal electrode 417 and a single crystal silicon region. The buffer layer is a polycrystalline silicon layer or a metal silicide. Such a buffer layer is necessary when the depth of diffusion of the n type base connecting region 47 is very shallow.

Figure 45:
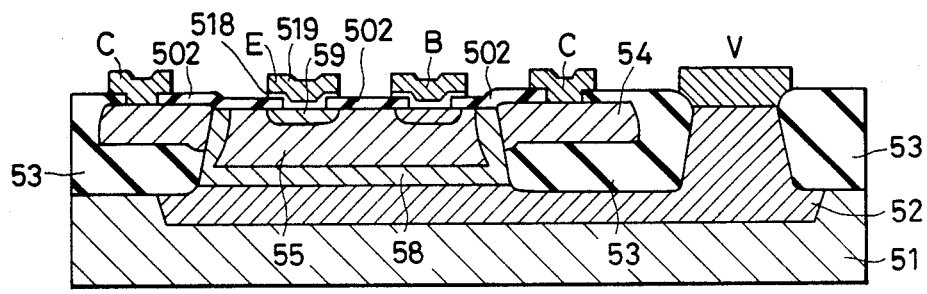

FIG. 45 illustrates another transistor embodying the present invention. In this embodiment, a buffer region is formed between a p type emitter region 59 and a metal electrode 519. When the epitaxial layer is thin and the depth of diffusion of the emitter needs to be shallow, a buffer layer 518 is necessary to prevent the anomalous diffusion of the impurity due to the alloying of the single crystal silicon layer with a metal and to prevent the accidental short-circuiting between the emitter and the base due to the separation of metal.

Figure 46:
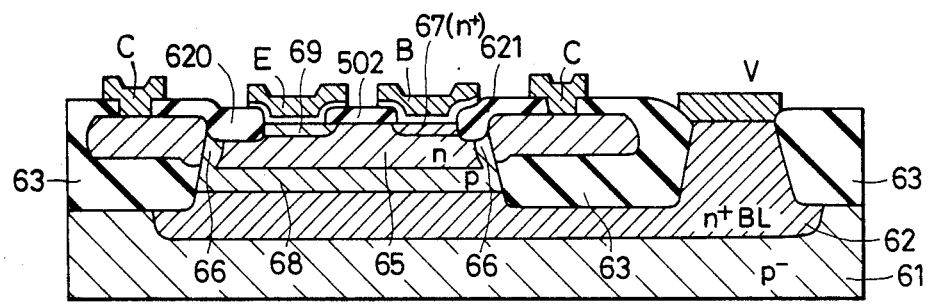

FIG. 46 illustrates a further transistor embodying the present invention. In this embodiment, a part of the circumference of an emitter region 69 and a part of the circumference of a base connecting region 67 having a high impurity concentration are in direct contact with oxide films 620 and 621, respectively, to microminiaturize the device and to reduce the parasitic capacitance. Since the emitter region 69 and the base connecting region 67 are separated from a p type region 66 by oxide films, respectively, both the size and the parasitic capacitance of the device are reduced approximately by 80% as compared with those of the abovementioned embodiment.

Figure 47:
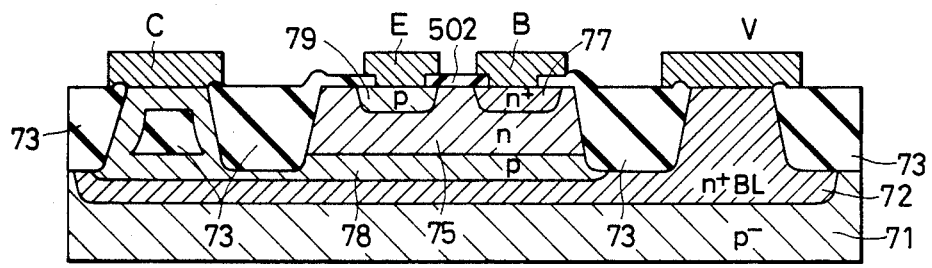

FIG. 47 illustrates a still further embodiment of the present invention. In this embodiment, the collector region is not led out through a polycrystalline silicon layer formed over the side surface of a convex single crystal silicon region. The collector region is led out through a metal electrode formed on top of a separate land connected to the extension of a p type buried layer 78 forming the collector region. Since any polycrystalline silicon layer need not to be formed in this embodiment, the manufacturing process is simplified.

As apparent from the foregoing description, the present invention provides transistor constructions which facilitate the adjustment of the width of the base, have a small parasitic capacitance and have the immunity from noise.

Naturally, the present invention is effective also when the p type and the n type are inverted to n type and p type, respectively.

Although the invention has been described in its preferred forms with a certain degree of particularity, it is to be understood that various changes and modifications may be made in the invention without departing from the spirit and scope thereof.

What is claimed is:

1. A semiconductor memory comprising: a semiconductor substrate; memory cells, each of which comprises first and second transistors formed on the semiconductor substrate and first and second load devices formed on the semiconductor substrate; upper and lower word lines for selecting the memory cells; bit lines for reading and writing information of the memory cells; and coupling devices for electrically interconnecting the bit lines and the memory cells, wherein buried layers of the first and second transistors are isolated from the buried layers of the first and second load devices and/or from buried layers of the coupling devices, and wherein the first and second transistors employ the buried layers as emitters, respectively, wherein each memory cell is constructed by interconnecting a base of said first transistor and a collector of said second transistor and interconnecting a collector of said first transistor and a base of said second transistor, said load devices are first and second pnp transistors, a collector of said first pnp transistor is connected to a base of said first transistors and a collector of said second transistor, a collector of said second pnp transistor is connected to a base of said second transistor and a collector of said first transistor, and emitters of said first and second pnp transistors are electrically connected to said upper word line, wherein a base of the first pnp transistor is connected to a collector of the first transistor and the base of the second transistor, wherein a base of the second pnp transistor is connected to a collector of the second transistor and the base of the first transistor, and wherein emitters of said first and second transistors are electrically connected to the lower word line.

2. A semiconductor memory according to claim 1, wherein said pnp transistors have shielding means for shielding the pnp transistors from noise produced within said substrate.

3. A semiconductor memory according to claim 2, wherein said shielding means is a doped region and wherein a predetermined voltage is applied to said doped region.

4. A semiconductor memory according to claim 1, further comprising:
   a first insulation region provided between the first transistor and the first load device, and
   a second insulation region provided between the second transistor and the second load device.

5. A semiconductor memory according to claim 1, wherein a first insulator region is provided so as to surround the first transistor, and a second insulator region is provided so as to surround the second transistor.

6. A semiconductor memory according to claim 1, wherein the first transistor, the second transistor, the first load device, the second load device, and the coupling devices are isolated by an insulation region from each other.

7. A semiconductor memory comprising: a semiconductor substrate; bipolar transistor formed on the semiconductor substrate; a memory cell array comprising a plurality of memory cell circuits arranged along word lines or bit lines, said memory cell circuit including at least two cross-coupled transistors of a first type isolated from each other; each of said first type transistors having a first layer of a first conductivity type buried in said semiconductor substrate and serving as an emitter, a second layer formed over the first type conductivity doped layer and serving as a base and a third layer formed over the second layer; a first and second collector load device for said memory cell circuit each including a transistor of a second type which is different from said first type; the bases of said first type and the collector of said second type transistors being interconnected to construct a pnpn structure; a fourth layer of the same conductivity type as that of the emitter of said first type transistor being formed below said second type transistor; and said fourth layer being connected to the word line, the bit line, a signal line like the word or bit line or a power supply line.

8. A semiconductor memory according to claim 7, wherein the base contact of each of said transistors is formed on a side surface of said second layer of a second conductivity type formed in a protruding region.

9. A semiconductor memory according to claim 7, further comprising:
   a first insulation region provided between the first transistor and the first load device, and
   a second insulation region provided between the second transistor and the second load device.

10. A semiconductor memory according to claim 7, wherein a first insulator region is provided so as to surround one of the two cross-coupled transistors, and a second insulator region is provided so as to surround the other of the two cross-coupled transistors.

11. A semiconductor memory comprising:
    a semiconductor substrate;
    memory cells, each of which comprises first and second transistors formed on the semiconductor substrate, and first and second load devices formed on the semiconductor substrate;
    word lines for selecting the memory cells;
    bit lines for reading and writing information of the memory cells; and
    coupling devices for electrically interconnecting the bit lines and the memory cells,
    wherein the first and second transistors employ buried layers within the substrate as emitters, respectively, and
    wherein the first and second load devices are isolated from the substrate, and further
    wherein at least one of the first and second load devices include a shield layer not forwardly biased with a buried layer of either one of the first and second load devices.

12. A semiconductor memory according to claim 11, wherein the buried layers of the first and second transistors are isolated from the buried layers of either one of the first and second load devices.

13. A semiconductor memory according to claim 11, wherein the coupling devices are diodes.

14. A semiconductor memory according to claim 11, wherein said memory cell is constructed by interconnecting the base of said first transistor and the collector of said second transistor and interconnecting the collector of said first transistor and the base of said second transistor, said load devices are first and second pnp transistors, the collector of said first pnp transistor is connected to the base of said first transistor and the collector of said second transistor, the collector of said second pnp transistor is connected to the base of said second transistor and the collector of said first transistor, and the emitters of said first and second pnp transistors are electrically connected to one of said word lines.

15. A semiconductor memory according to claim 22, further comprising:
    a first insulation region provided between the first transistor and the first load device, and
    a second insulation region provided between the second transistor and the second load device.

16. A semiconductor memory according to claim 11, wherein a first insulator region is provided so as to surround the first transistor, and a second insulator region is provided so as to surround the second transistor.

17. A semiconductor memory according to claim 11, wherein the first transistor, the second transistor, the first load device, the second load device and the coupling devices are isolated by an insulation region from each other.

18. A semiconductor memory comprising:
    a semiconductor substrate;
    memory cells, each of comprises first and second transistors formed on the semiconductor substrate,
    wherein the first and second transistors have a first protruding portion, said first protruding portion having a single crystal side surface;
    an insulation film having a first opening, said insulation film being formed on a surface of said substrate so as to provide said first opening is located at said first protruding portion;
    a first conductive layer formed on said single crystal surface of the first protruding portion and on said insulation film, wherein said first conductive layer is formed by being deposited on an exposed surface of said first protruding portion after said first protruding portion has been formed;

a first region formed in said first protruding portion in contact with said first conductive layer;

first and second load devices formed on the semiconductor substrate;

word lines for selecting the memory cells;

bit lines for reading and writing information of the cells; and coupling devices for electrically interconnecting the bit lines and the memory cells, wherein buried layers of the first and second transistors are isolated from buried layers of the coupling devices, and wherein the first and second transistors employ the buried layers as emitters, respectively, and further wherein the coupling devices are transistors having a buried layer isolated from the buried layer of the first and second transistors.

19. A semiconductor memory according to claim 13, wherein the first transistor, the second transistor, the first load device, the second load device and the coupling devices are isolated by an insulation region from each other.

20. A semiconductor memory according to claim 18, wherein each memory cell is constructed by interconnecting a base of said first transistor and a collector of the second transistor and interconnecting a collector of said first transistor and a base of said second transistor, and wherein said load devices are Schottky barrier diodes electrically connected to nodes where the collectors and bases of said first and second transistors are connected.

21. A semiconductor memory according to claim 20, wherein said Schottky barrier diodes include shielding means for shielding the Schottky barrier diodes from noise produced within the semiconductor substrate.

22. A semiconductor memory according to claim 21, wherein said shielding means is a doped region of a same conduction type as a conductivity type of said semiconductor substrate, and wherein a voltage is applied to said doped region.

23. A semiconductor memory according to claim 18, wherein the first and second load devices are isolated from the semiconductor substrate.

24. A semiconductor memory according to claim 23, wherein the first and second load devices are formed on an insulator.

25. A semiconductor memory according to claim 18, wherein the buried layers of the first and second transistors are isolated from buried layers of the first and second load devices.

26. A semiconductor memory according to claim 18, wherein said load devices are pnp transistors.

27. A semiconductor memory according to claim 26, wherein said pnp transistor have shielding means for shielding the pnp transistors from noise produced within said substrate.

28. A semiconductor memory according to claim 27, wherein said shielding means is a doped region, and wherein a predetermined voltage is applied to said doped region.

29. A semiconductor memory comprising:
a semiconductor substrate;
a plurality of memory cells, each of which comprises first and second transistors formed on the semiconductor substrate and first and second load devices formed on the semiconductor substrate;

upper and lower word lines for selecting the memory cells;

bit lines for reading and writing information of the cells; and third and fourth transistors for electrically interconnecting the bit lines and the memory cell, wherein buried layers of the first and second transistors are isolated from buried layers of the third and fourth transistors, wherein the first, second, third and fourth transistors employ buried layers as emitters respectively, and further wherein emitters of the first and second transistors are electrically connected to the lower word line, wherein emitters of the third and fourth transistors are electrically connected to the bit lines, and bases of the third and fourth transistors are electrically connected to bases of the first and second transistors, respectively, and collectors of the third and fourth transistors are electrically connected to collectors of the first and second transistors, respectively, wherein the first load devices are electrically coupled between the collectors of first and third transistors and the upper word line, and wherein the second load devices are provided between the collector of second and fourth transistors and the upper word line.

30. A semiconductor memory according to claim 27, wherein the first and second load devices are isolated from the semiconductor substrate.

31. A semiconductor memory according to claim 29, further comprising:
a first insulation region provided between the first transistor and the first load device, and
a second insulation region provided between the second transistor and the second load device.

32. A semiconductor memory according to claim 29, wherein a first insulator region is provided so as to surround the first transistor, and a second insulator region is provided so as to surround the second transistor.

33. A semiconductor memory according to claim 29, wherein the first transistor, the second transistor, the first load device, the second load device, the third transistor and the fourth transistor are isolated by an insulation region from each other.

34. A semiconductor memory according to claim 29, wherein each memory cell is constructed by interconnecting a base of said first transistor and a collector of the second transistor and interconnecting a collector of said first transistor and a base of said second transistor, and wherein said load devices are Schottky barrier diodes electrically connected to nodes where the collectors and bases of said first and second transistors are connected.

35. A semiconductor memory according to claim 34, wherein said Schottky barrier diodes have shielding means for shielding the Schottky barrier diodes from noise produced within the semiconductor substrate.

36. A semiconductor memory according to claim 35, wherein said shielding means is a doped region of a same conduction type as a conductivity type of said semiconductor substrate, and wherein a predetermined voltage is applied to said doped region.

37. A semiconductor memory according to claim 29, wherein the first and second load devices are formed on an insulator.

* * * * *